(12) United States Patent
Kogetsu et al.

(10) Patent No.: US 7,964,307 B2
(45) Date of Patent: Jun. 21, 2011

(54) NEGATIVE ELECTRODE FOR LITHIUM ION SECONDARY BATTERY, METHOD FOR PRODUCING THE SAME, AND LITHIUM ION SECONDARY BATTERY

(75) Inventors: Yasutaka Kogetsu, Osaka (JP); Masaya Ugaji, Osaka (JP)

(73) Assignee: Panasonic Corporation, Osaka (JP)

(*) Notice: Subject to any disclaimer, the term of this patent is extended or adjusted under 35 U.S.C. 154(b) by 1006 days.

(21) Appl. No.: 11/826,814

(22) Filed: Jul. 18, 2007

(65) Prior Publication Data

US 2008/0020281 A1    Jan. 24, 2008

(30) Foreign Application Priority Data

Jul. 24, 2006    (JP) .................. 2006-200778

(51) Int. Cl.
*H01M 4/134* (2010.01)
*H01M 4/38* (2010.01)
*H01M 4/66* (2006.01)

(52) U.S. Cl. ..................... 429/218.1; 429/245

(58) Field of Classification Search ............. None
See application file for complete search history.

(56) References Cited

U.S. PATENT DOCUMENTS

2005/0079421 A1  4/2005 Konishiike et al.
2006/0134518 A1* 6/2006 Kogetsu et al. ......... 429/218.1

FOREIGN PATENT DOCUMENTS

| JP | 2001-266851 |   | 9/2001 |
| JP | 2002-373644 |   | 12/2002 |
| JP | 2004-349162 |   | 12/2004 |
| JP | 2005-63764 | * | 3/2005 |
| JP | 2005-196970 |   | 7/2005 |
| JP | 3702224 |   | 7/2005 |
| KR | 10-2005-0026348 A |   | 3/2005 |

* cited by examiner

*Primary Examiner* — Jonathan Crepeau
(74) *Attorney, Agent, or Firm* — McDermott Will & Emery LLP

(57) ABSTRACT

A negative electrode for a lithium ion secondary battery includes a current collector, an intermediate layer formed on a surface of the current collector, and an active material layer formed on the intermediate layer. The current collector includes a metal capable of being alloyed with silicon. The active material layer includes an active material including silicon. The intermediate layer includes silicon and oxygen. The intermediate layer prevents the metal capable of being alloyed with silicon from diffusing into the active material layer. The diffusion of the constituent element of the current collector into the active material layer is suppressed.

15 Claims, 11 Drawing Sheets

F I G. 5
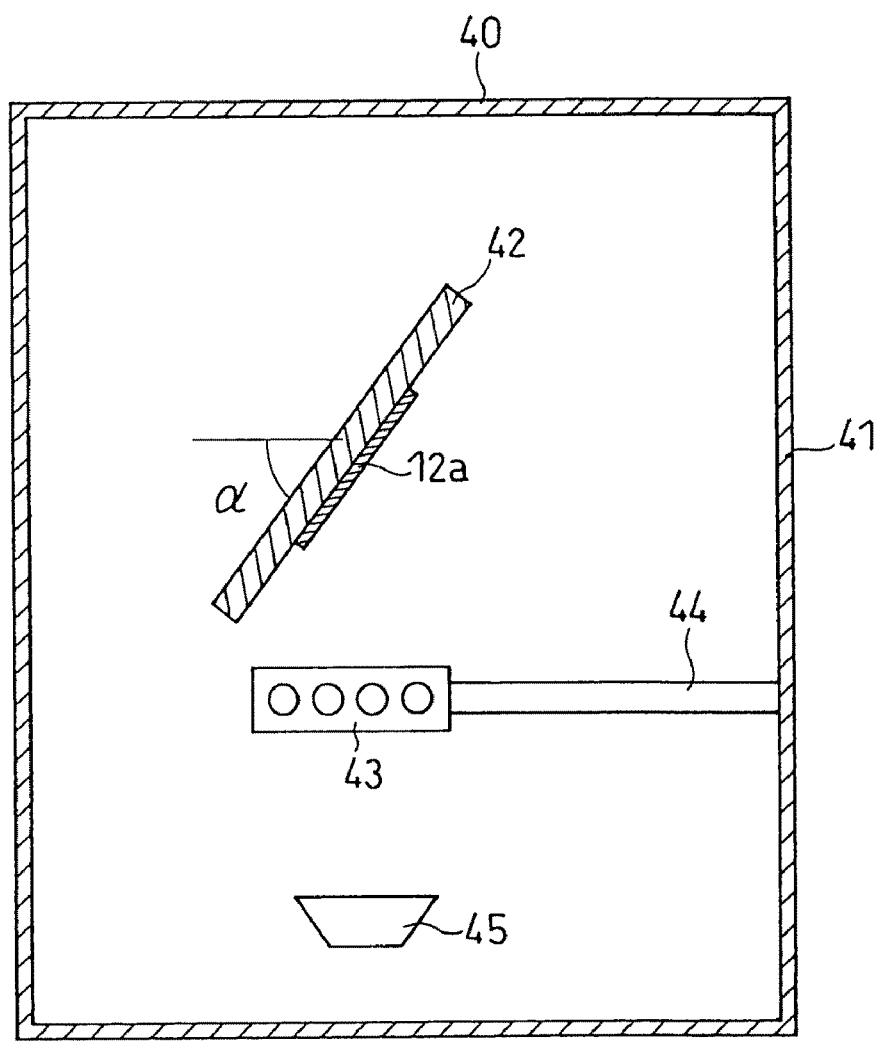

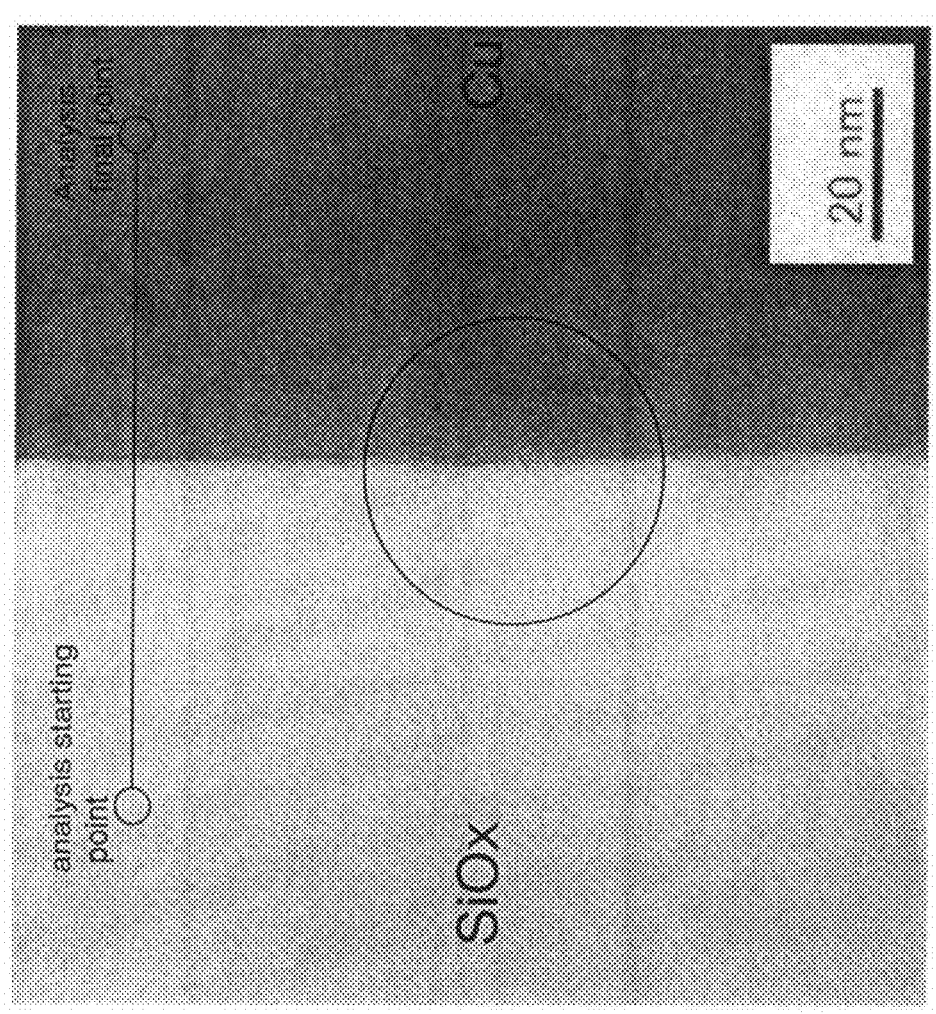

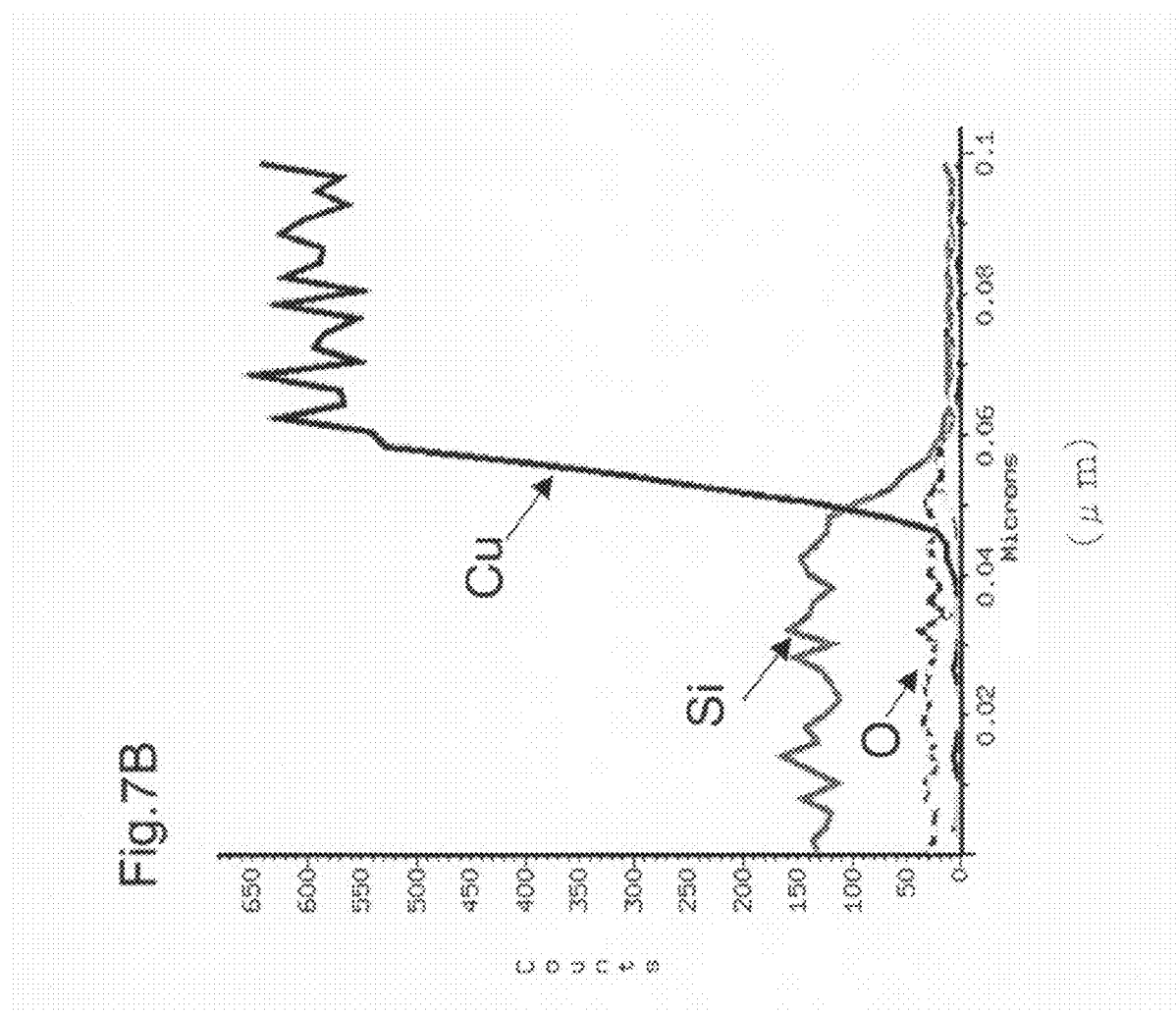

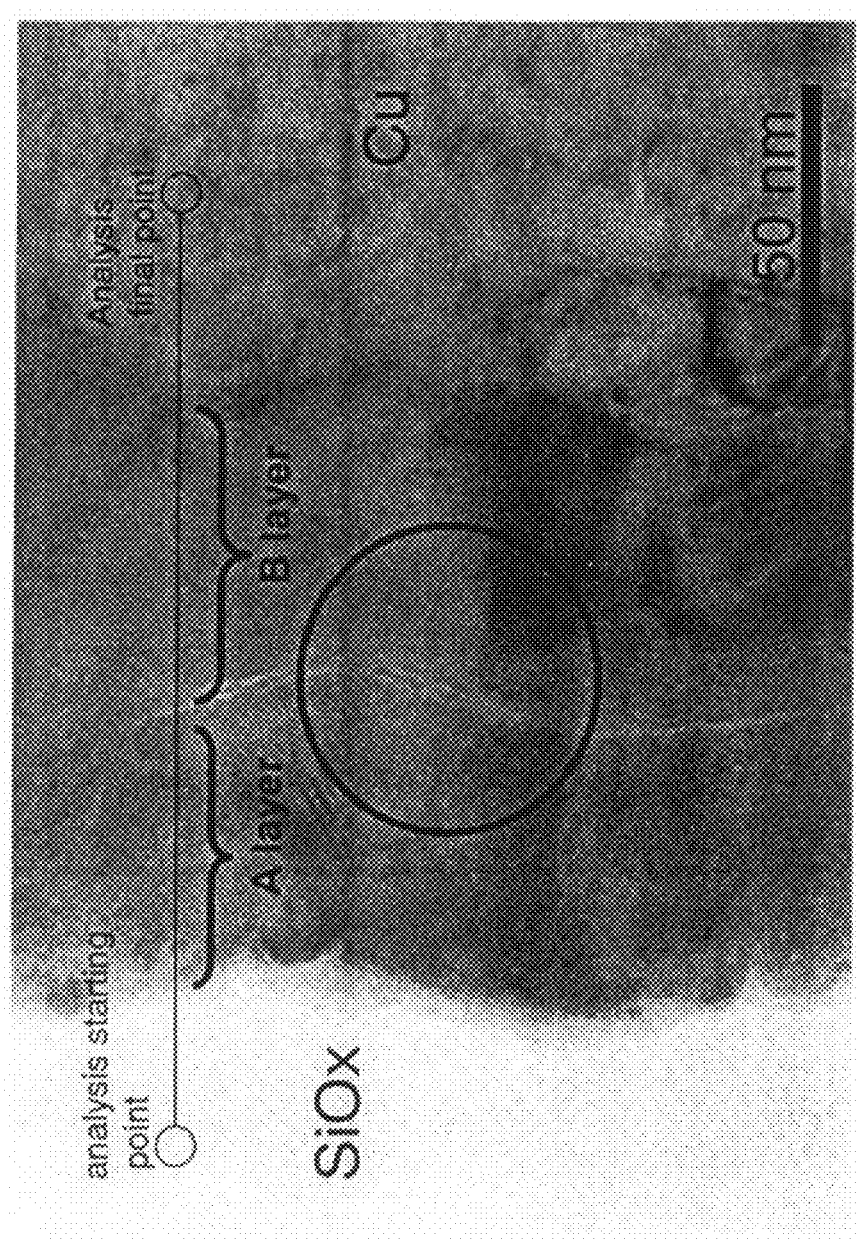

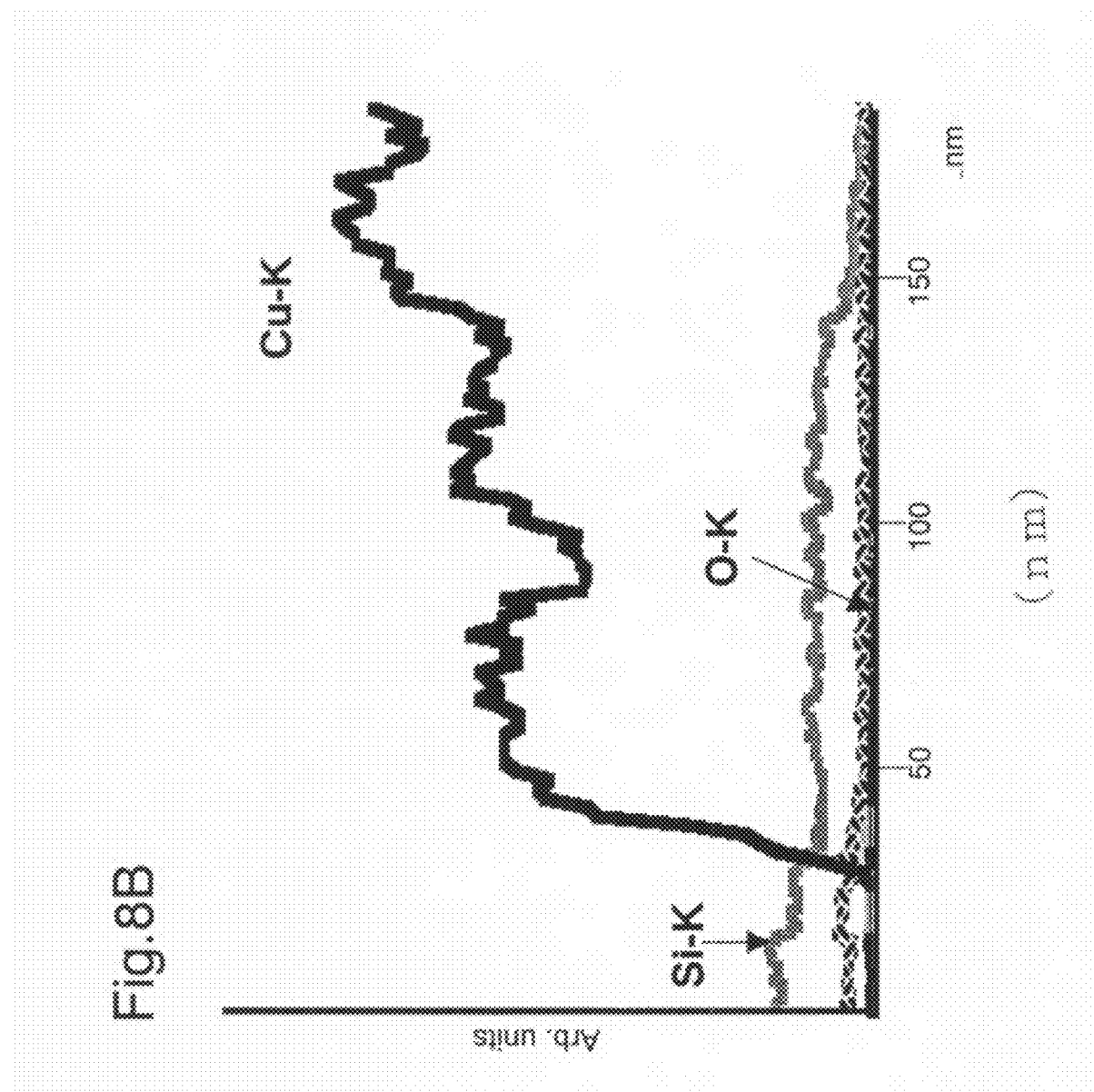

NEGATIVE ELECTRODE FOR LITHIUM ION SECONDARY BATTERY, METHOD FOR PRODUCING THE SAME, AND LITHIUM ION SECONDARY BATTERY

FIELD OF THE INVENTION

The present invention relates to lithium ion secondary batteries, and, more particularly, to a negative electrode for lithium ion secondary batteries.

BACKGROUND OF THE INVENTION

With the recent development of portable devices such as personal computers and cellular phones, there is an increasing demand for batteries used as the power source for such devices. In such applications, batteries are required to operate at room temperature and provide high energy density and excellent cycle characteristics. To meet such requirements, silicon (Si) or tin (Sn), and oxides or alloys thereof are viewed as promising negative electrode active materials that can offer significantly high capacities.

However, when such a material absorbs lithium, its crystal structure changes, so that its volume increases. A large volume change in an active material on charge/discharge results in, for example, a poor contact between the active material and a current collector and therefore a reduction in charge/discharge cycle life.

Japanese Patent No. 3702224 (hereinafter "Patent Document 1") proposes forming an amorphous silicon thin film on copper foil by vapor deposition or sputtering. Patent Document 1 states that due to the diffusion of copper in the silicon thin film, the silicon thin film is firmly bonded to the copper foil, and therefore that even an expansion of silicon does not result in a degradation of current collecting performance.

However, since the diffusion coefficient of copper in silicon is high, copper may excessively diffuse into the silicon thin film. As a result, the copper foil becomes brittle, and further, copper is alloyed with silicon, leading to a reduction in charge/discharge capacity.

Japanese Laid-Open Patent Publication No. 2002-373644 ("Patent Document 2") proposes forming an intermediate layer made of Mo or W on the surface of a current collector. The intermediate layer serves to prevent the constituent element of the current collector from excessively diffusing into an active material layer.

Patent Document 1 proposes controlling the temperature of the current collector at less than 300° C. during the formation of the silicon thin film, in order to prevent excessive diffusion of copper into the silicon thin film. However, since the diffusion coefficient of copper in silicon is high, it is difficult to suppress diffusion by merely controlling the temperature at less than 300° C. Also, in vapor deposition and sputtering, if the deposition speed is heightened to enhance production efficiency, the temperature of the copper foil rises. In order to control the temperature of the copper foil at less than 300° C., it is necessary to make the deposition speed low, which results in a reduction in production efficiency.

When a silicon thin film is formed on copper foil, the copper foil may curve due to the accumulation of internal stress in the silicon thin film. Such internal stress is relieved by heat-treating the obtained silicon thin film together with the copper foil. However, the heat treatment may cause excessive diffusion of copper into the silicon thin film.

Also, an effective method for compensating for the irreversible capacity loss of the negative electrode is deposition of lithium on the silicon thin film. However, when lithium is deposited, the temperature of the copper foil rises, so that copper may excessively diffuse into the silicon thin film.

As described above, with the method of Patent Document 1, it is difficult to control the diffusion of copper into the silicon thin film. Since a change in the amount of copper diffusion will cause a change in the charge/discharge capacity of the silicon thin film, it is difficult to obtain stable quality. Also, with the method of Patent Document 1, the interface between the copper foil and the silicon thin film becomes brittle, so the silicon thin film becomes separated during charge/discharge, thereby resulting in degradation of cycle characteristics.

Patent Document 2 proposes the formation of an intermediate layer comprising tungsten or molybdenum. Tungsten or molybdenum, however, does not serve as an active material. When a material that does not serve as an active material is used as the intermediate layer, the energy density of the negative electrode decreases. Also, since tungsten or molybdenum has a high melting point, it is difficult to increase the deposition speed. Hence, the formation of the intermediate layer requires large costs such as machine costs and operation costs.

BRIEF SUMMARY OF THE INVENTION

The present invention relates to a negative electrode for a lithium ion secondary battery, including a current collector, an intermediate layer formed on a surface of the current collector, and an active material layer formed on the intermediate layer. The current collector comprises a metal capable of being alloyed with silicon. The active material layer comprises an active material comprising silicon. The intermediate layer includes silicon and oxygen and prevents the metal capable of being alloyed with silicon from diffusing into the active material layer.

By forming the intermediate layer between the current collector and the active material layer, the constituent element of the current collector can be prevented from diffusing into the active material layer. The reason why the intermediate layer including silicon and oxygen can prevent the diffusion of the constituent element of the current collector is not yet clear, but it is probably as follows.

In the intermediate layer including silicon and oxygen, the silicon and the oxygen are strongly bound together by covalent bonding. In order for the constituent element of the current collector to diffuse through the intermediate layer, the constituent element of the current collector needs to cut the bond between the silicon and the oxygen and combine with the silicon. However, it is difficult even for a metal capable of being alloyed with silicon (e.g., copper or nickel) to cut the bond between the silicon and the oxygen and combine with the silicon. Thus, by interposing the intermediate layer including silicon and oxygen between the current collector and the active material layer, the diffusion of the constituent element of the current collector into the active material layer is suppressed.

The present invention also pertains to a method for producing a negative electrode for a lithium ion secondary battery. This method includes the steps of: forming an intermediate layer including silicon and oxygen on a current collector comprising a metal capable of being alloyed with silicon, the intermediate layer being provided for preventing diffusion of the metal; and forming an active material layer on the intermediate layer. During a process of forming at least one of the intermediate layer and the active material layer, the temperature of the current collector is 300° C. to 700° C.

The production method of the present invention can further include the step of depositing lithium on the active material layer. In this case, during a process of depositing the lithium, the temperature of the current collector is preferably 300° C. to 700° C.

The production method of the present invention can further include the step of heating the current collector, the intermediate layer, and the active material layer at the same time. In this case, the temperature of the heat treatment (heating temperature) is preferably 300° C. to 700° C.

According to these methods, it is possible to enhance the production efficiency of negative electrodes for lithium ion secondary batteries. For example, it is possible to select a production condition in which the deposition speed is heightened to form an active material layer in a short time. It is also possible to select a high-temperature and short-time condition for heat treatment that is performed to remove moisture on the surface of the active material layer formed.

By forming the intermediate layer between the current collector and the active material layer, the diffusion of the constituent element of the current collector into the active material layer can be suppressed. Hence, in an aspect of the invention, the current collector does not become so brittle and the adhesion of the active material layer to the current collector is sufficiently maintained. It is therefore possible to provide a lithium ion secondary battery with good cycle characteristics.

The intermediate layer includes silicon just like the active material layer. That is, the intermediate layer is capable of absorbing and desorbing lithium and functions as an active material. Thus, in an aspect of the invention, even if the intermediate layer is formed, the energy density of the negative electrode does not decrease, which makes it possible to provide a lithium ion secondary battery with a high capacity. Also, since the intermediate layer includes silicon just like the active material layer, the production process can be simplified and the production efficiency can also be improved. It therefore becomes possible to produce a negative electrode at low costs.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE SEVERAL VIEWS OF THE DRAWING

FIG. 5 is a schematic view of an example of a device for producing a negative electrode for a lithium ion secondary battery according to the present invention;

FIG. 7A is a TEM photo of the interface between copper foil and an intermediate layer according to Example 1 of the present invention;

FIG. 7B shows the result of an elemental analysis along the line in FIG. 7A;

FIG. 8A is a TEM photo of the interface between copper foil and an intermediate layer according to Comparative Example 2 of the present invention;

FIG. 8B shows the result of an elemental analysis along the line in FIG. 8A.

DETAILED DESCRIPTION OF THE INVENTION

The present invention is hereinafter described with reference to drawings, but is not limited to the following description.

Figure 1:
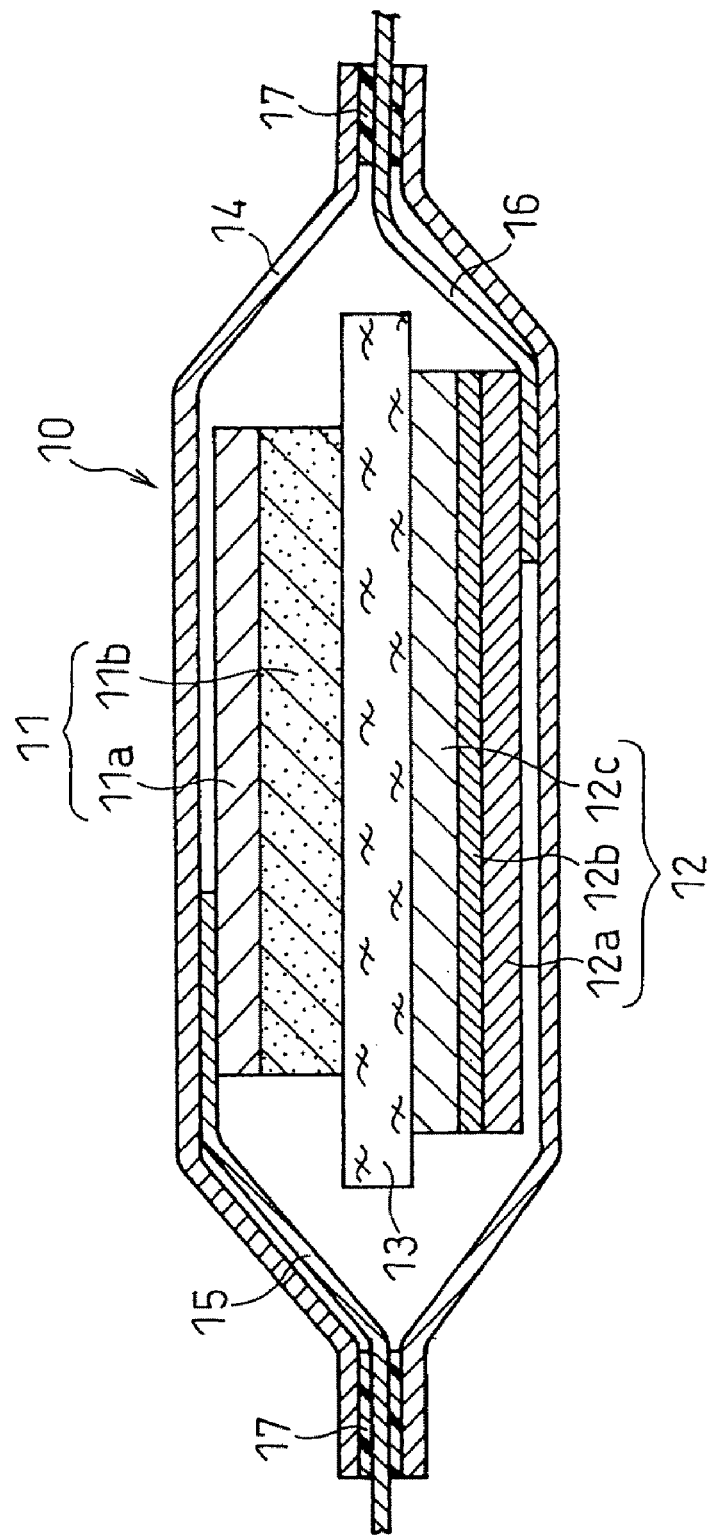
FIG. 1 is a longitudinal sectional view of an example of layered-type lithium ion secondary batteries.

FIG. 1 is a schematic cross-sectional view of an example of layered-type lithium ion secondary batteries.

A battery 10 includes an electrode assembly composed of a positive electrode 11, a negative electrode 12, and a separator 13 interposed therebetween. The electrode assembly and a lithium-ion conductive electrolyte are housed in a battery case 14. The lithium-ion conductive electrolyte is impregnated into the separator 13. The positive electrode 11 is composed of a positive electrode current collector 11a and a positive electrode active material layer 11b carried on the positive electrode current collector 11a. The negative electrode 12 is composed of a negative electrode current collector 12a, a negative electrode intermediate layer (hereinafter "intermediate layer") 12b carried on the negative electrode current collector 12a, and a negative electrode active material layer 12c. One end of a positive electrode lead 15 and one end of a negative electrode lead 16 are connected to the positive electrode current collector 11a and the negative electrode current collector 12a, respectively, and the other ends thereof are drawn out of the battery case 14. The opening of the battery case 14 is sealed with a resin material 17.

The positive electrode active material layer 11b releases lithium during charge and absorbs lithium released by the intermediate layer 12b and the negative electrode active material layer 12c during discharge. The intermediate layer 12b and the negative electrode active material layer 12c absorb the lithium released by the positive electrode active material layer 11b during charge and release the lithium during discharge.

Figure 2:
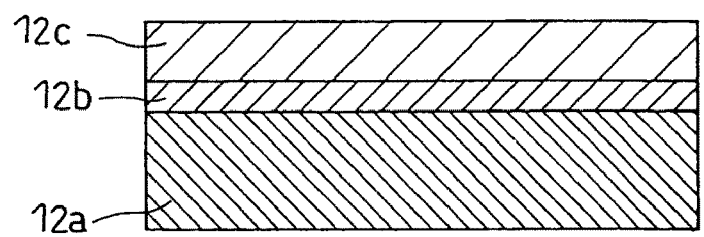
FIG. 2 is a schematic cross-sectional view of the structure of a negative electrode for a lithium ion secondary battery according to the present invention.

FIG. 2 is a schematic cross-sectional view of the structure of the negative electrode 12. On the surface of the negative electrode current collector (hereinafter "current collector") 12a is the intermediate layer 12b. On the intermediate layer 12b is the negative electrode active material layer (hereinafter "active material layer") 12c.

Figure 3:
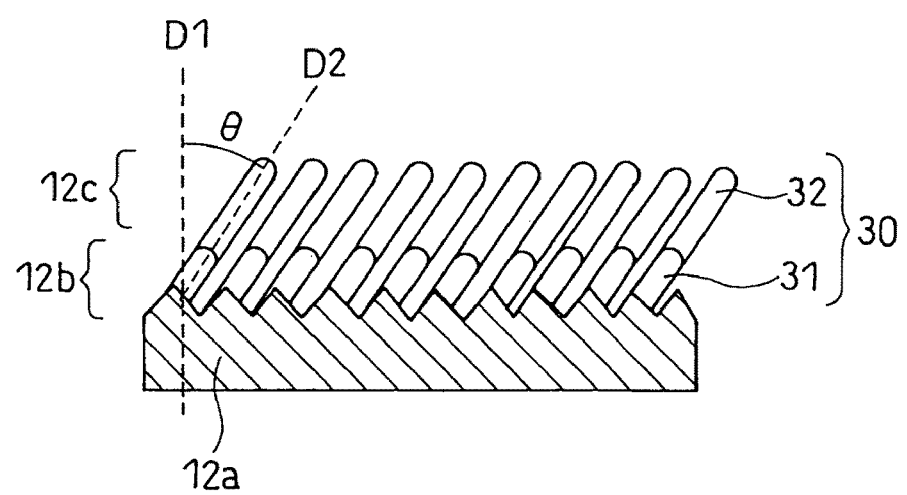
FIG. 3 is a schematic cross-sectional view of the structure of an active material layer of the negative electrode for a lithium ion secondary battery according to the present invention.

FIG. 3 is a schematic cross-sectional view of the structure of the active material layer 12c. The intermediate layer 12b and the active material layer 12c include a plurality of columnar particles 30. The columnar particles 30 are grown slantwise relative to the direction D1 of the normal to the surface of the current collector 12a. The angle between the growing direction D2 of the columnar particles 30 and the direction D1 of the normal to the surface of the current collector 12a is θ (e.g., 10°≦θ≦80°). The columnar particles 30 comprise lower columnar particles 31 and upper columnar particles 32. The lower columnar particles 31 form the intermediate layer 12b, and the upper columnar particles 32 form the active material layer 12c.

The lower columnar particles 31 and the upper columnar particles 32 may be monocrystalline particles, polycrystalline particles comprising a plurality of crystallites (crystal grains), microcrystalline particles with a crystallite size of 100 nm or less, or amorphous. The growing directions of the lower columnar particles 31 and the upper columnar particles 32 may be the same or different.

Adjacent columnar particles may stick or combine together in the course of growing, but they start to grow at different positions. Thus, the number of columnar particles can be regarded as the same as the number when they started to grow.

It should be noted that although FIG. 1 shows an example of layered-type lithium ion secondary batteries, the negative electrode for a lithium ion secondary battery of the present invention is applicable to cylindrical and prismatic batteries having spiral-type electrode assemblies. When the present invention is applied to a layered-type lithium ion secondary battery, three or more layers may be formed by laminating one or more positive electrodes each having a positive electrode active material layer on one side or both sides and one or more negative electrodes each having a negative electrode active material layer on one side or both sides. At this time, electrodes are disposed such that all the positive electrode active material layers are opposed to the negative electrode active material layers and that all the negative electrode active material layers are opposed to the positive electrode active material layers. The slanting directions of the columnar particles in the respective negative electrode active material layers may be the same or different. Also, the slanting directions of the respective columnar particles in the same negative electrode may be different. When a negative electrode has a negative electrode active material layer on both sides (i.e., one on each side), the slanting directions of the columnar particles on both sides may be the same or different.

The intermediate layer includes silicon and oxygen. The silicon and the oxygen are strongly bound together by covalent bonding. In order for the constituent element of the current collector to diffuse through the intermediate layer, the constituent element of the current collector needs to cut the bond between the silicon and the oxygen and combine with the silicon. However, it is difficult even for a metal capable of being alloyed with silicon (e.g., copper or nickel) to cut the bond between the silicon and the oxygen and combine with the silicon. Thus, by interposing the intermediate layer including silicon and oxygen between the current collector and the active material layer, the diffusion of the constituent element (copper or nickel) of the current collector into the active material layer is suppressed.

The intermediate layer including silicon and oxygen is composed of, for example, a silicon oxide or a mixture of silicon and a silicon oxide. Silicon and a silicon oxide function as active materials. The composition of the intermediate layer may be homogeneous or inhomogeneous. The distribution of silicon and oxygen in the intermediate layer is not particularly limited. The intermediate layer may be partially composed of silicon alone or $SiO_2$. The intermediate layer may contain elements other than silicon and oxygen, for example, carbon (C) and nitrogen (N).

The thickness of the intermediate layer is preferably 0.1 μm or more, or 1 μm or more, and 10 μm or less. If the thickness of the intermediate layer is less than 0.1 μm, the diffusion of the constituent element of the current collector into the active material layer may not be prevented. Also, the thickness of the active material layer is preferably 0.1 μm to 100 μm. More preferably, the total thickness of the active material layer and the intermediate layer is 100 μm or less, or 50 μm or less. If the total thickness is greater than 100 μm, the expansion stress of the active material layer upon charge may become excessive.

The thickness of the active material layer, the thickness of the intermediate layer, or the total thickness of the active material layer and the intermediate layer can be obtained by using a center line corresponding to the surface of the current collector, the surface of the intermediate layer, or the surface of the active material layer in a cross-section of the negative electrode. That is, the thickness of the active material layer is a distance from the center line corresponding to the surface of the intermediate layer to the center line corresponding to the surface of the active material layer. The thickness of the intermediate layer is a distance from the center line corresponding to the surface of the current collector to the center line corresponding to the surface of the intermediate layer. The total thickness of the active material layer and the intermediate layer is a distance from the center line corresponding to the surface of the current collector to the center line corresponding to the surface of the active material layer.

As used herein, "the center line" is a term that is used to define surface roughness Ra in Japanese Industrial Standards (JIS), and refers to a straight line obtained by the average value of roughness curve. Specifically, a negative electrode with an intermediate layer and an active material layer is impregnated with resin and the resin is cured, and the resulting negative electrode with the cured resin is ground or polished so as to obtain a cross-section perpendicular to the main surface of the current collector. The ground cross-section is observed with an SEM to obtain the center lines corresponding to the surface of the current collector, the surface of the intermediate layer, and the surface of the active material layer.

However, thickness can be obtained in a simpler manner as follows. The thickness of an intermediate layer can be obtained by measuring the thickness of a current collector using a common thickness gauge, measuring the thickness of the current collector with an intermediate layer formed thereon, and calculating the difference therebetween. Likewise, the total thickness of an intermediate layer and an active material layer can be obtained by measuring the thickness of a current collector, measuring the thickness of the current collector with an intermediate layer and an active material layer formed thereon (the thickness of the resulting negative electrode), and calculating the difference therebetween. It has been experimentally demonstrated that the results thus obtained are in substantial agreement with the thickness measured precisely by using center lines.

The intermediate layer includes a silicon oxide represented by, for example, $SiO_x$. The preferable range of the value x representing the oxygen content is $0.1 \leq x < 2$ or $0.1 \leq x \leq 1$, in terms of suppressing the diffusion of the constituent element of the current collector, such as copper or nickel. It should be noted, however, that the present inventors have found that even when the amount of oxygen contained in the intermediate layer is small (the value x is low), the diffusion of the constituent element of the current collector into the active material layer is suppressed.

A metal capable of being alloyed with silicon, which is the constituent element of the current collector, may diffuse into the intermediate layer to form a mixed layer. The mixed layer includes the constituent element of the current collector, silicon, and oxygen. The thickness of the mixed layer is desirably 1 μm or less. If the thickness of the mixed layer is greater than 1 μm, the current collector may become brittle. When the current collector becomes brittle, the current collection between the current collector and the intermediate layer or the active material layer becomes poor, so that the cycle characteristics may degrade. Also, the constituent element of the current collector is alloyed with silicon contained in the intermediate layer and the active material layer, so that the battery capacity may decrease.

The thickness of the mixed layer is obtained by area analysis in which the interface between the current collector and the intermediate layer is analyzed parallel to the main surface of the current collector. The region in which the ratio of the constituent element of the current collector to all the elements present in the analyzed area is 10 to 90 mol % is defined as the mixed layer. Such area analysis is performed, for example, by X-ray photoelectron spectroscopy (also referred to as electron spectroscopy for chemical analysis (ESCA)), Auger electron spectroscopy, or secondary ion mass spectroscopy. According to these area analyses, elements contained in a region with a thickness of approximately a few tens of nm can be quantified.

For example, when the current collector is copper foil and the elements present (detected) in the analyzed area are Cu, Si, and O, the ratio of the constituent element of the current collector (the copper ratio) is represented by the formula:

(the number of moles of Cu)/(the number of moles of Cu+the number of moles of Si+the number of moles of O)

Even when there is no mixed layer, the interfacial bonding strength is sufficient and there is no particular problem. However, it is difficult to prove that there is no mixed layer between the current collector and the intermediate layer in a given area according to current analytical methods which are described below.

The thickness of the mixed layer is equivalent to the thickness of the region in which the ratio of the constituent element of the current collector is 10 mol % to 90 mol % (diffusion width). The relation between the distance in the depth direction of the intermediate layer and the elemental ratio can be obtained, for example, by X-ray photoelectron spectroscopy, Auger electron spectroscopy, or secondary ion mass spectroscopy. Specifically, the relation can be obtained by repeating the following operations of: subjecting the intermediate layer to an area analysis in a direction parallel to the main surface of the current collector to determine the elemental ratio; and etching the intermediate layer by ion sputtering such as argon. The thickness of a mixed layer determined by such a method tends to be greater than an actual thickness due to the irregularities of an analyzed area on the atomic level and variations in argon sputtering in an analyzed area.

The active material layer includes an active material containing silicon. The active material layer may further include oxygen, nitrogen, or titanium in addition to silicon. Examples of active materials containing silicon include silicon, silicon alloys, compounds containing silicon and oxygen or silicon oxides, compounds containing silicon and nitrogen or silicon nitrides, and compounds or alloys containing silicon and titanium. They may be used singly to form an active material layer, or may be used in combination to form an active material layer. Examples of active material layers containing a plurality of active materials include an active material layer containing silicon, oxygen, and nitrogen, and an active material layer containing a plurality of silicon oxides with different oxygen contents. The composition of the active material layer may be the same as that of the intermediate layer.

In compounds or alloys containing silicon and titanium, the molar ratio of Ti atoms to Si atoms: Ti/Si is preferably 0<Ti/Si<2, and more preferably $0.1 \leq Ti/Si \leq 1.0$. Such active materials are preferable since they have small irreversible capacity and undergo small volume change due to expansion and contraction. Also, titanium is inexpensive. If the Ti/Si ratio is too low, such an active material layer may become broken or separated from a current collector due to large expansion stress. If the Ti/Si ratio is too high, the charge/discharge capacity decreases and the high capacity inherent in silicon cannot be fully utilized.

Compounds containing silicon and oxygen or silicon oxides are desirably represented by general formula (1): $SiO_x$ where 0<x<2 or $0.01 \leq x \leq 1$ (the value x represents the oxygen content). Such active materials are preferable since they have small irreversible capacity and undergo relatively small volume change due to expansion and contraction. If the value x is too low, such an active material layer may become broken or separated from a current collector due to large expansion stress. If the value x is too high, the charge/discharge capacity decreases and the high capacity inherent in silicon may not be fully utilized. When the intermediate layer contains a silicon oxide represented by $SiO_{x1}$ where $0.1 \leq x1 < 2$ and the active material layer contains a silicon oxide represented by $SiO_{x2}$ where $0.01 \leq x2 \leq 1$, it is preferable that $1 < x1/x2 \leq 10$ or $2 \leq x1/x2 \leq 10$, in order to sufficiently prevent the diffusion of the constituent element of the current collector into the active material layer.

Compounds containing silicon and nitrogen or silicon nitrides are preferably represented by general formula (2): $SiN_y$, where 0<y<4/3 or $0.01 \leq y \leq 1$ (the value y represents the nitrogen content). Such active materials are preferable since they have small irreversible capacity and undergo relatively small volume change due to expansion and contraction. Also, nitrogen is inexpensive. If the value y is too low, such an active material layer may become broken or separated from a current collector due to large expansion stress. If the value y is too high, the charge/discharge capacity decreases and the high capacity inherent in silicon may not be fully utilized.

In the negative electrode for a lithium ion secondary battery of the present invention, the intermediate layer and the active material layer may be in the form of a homogeneous (uniform) film or may be composed of a plurality of columnar particles. When the intermediate layer and the active material layer are composed of columnar particles, their particle size tends to be uniform, which results in uniform charge/discharge reactions. On the other hand, if the intermediate layer and the active material layer are in the form of a homogeneous film, the intermediate layer or the active material layer becomes cracked randomly due to charge, which may result in formation of columnar particles with varying particle sizes.

An active material layer including a plurality of columnar particles can be obtained, for example, by roughening the surface of a current collector and depositing an active material on the surface thereof. While the columnar particles may be in contact with one another, they are preferably not in contact with one another. The columnar particles may be grown parallel to the direction of the normal to the surface (main surface) of the current collector or may be grown slantwise relative to the direction of the normal to the surface of the current collector. When the columnar particles are slanted, space tends to be formed easily between adjacent columnar particles and such space serves to relieve the stress upon expansion of the active material.

The columnar particles may include a plurality of subparticles (grain layers) that are laminated and grown slantwise relative to the direction of the normal to the surface of the current collector. The subparticles or grain layers are preferably inclined in different directions. In this case, space can be formed around the columnar particles more easily, and such space serves to relieve the stress upon expansion of the active material and prevent contact between adjacent columnar particles. By laminating subparticles that are inclined in different directions, it is possible to form columnar particles that are apparently grown substantially parallel to the direction of the normal to the surface of the current collector. Such columnar particles reduce the stress at the interface between the active material and the current collector upon expansion of the active material. Hence, even when the active material layer is thick, it is prevented from becoming wrinkled.

Subparticles that are inclined in different directions are described with reference to a drawing.

Figure 4:
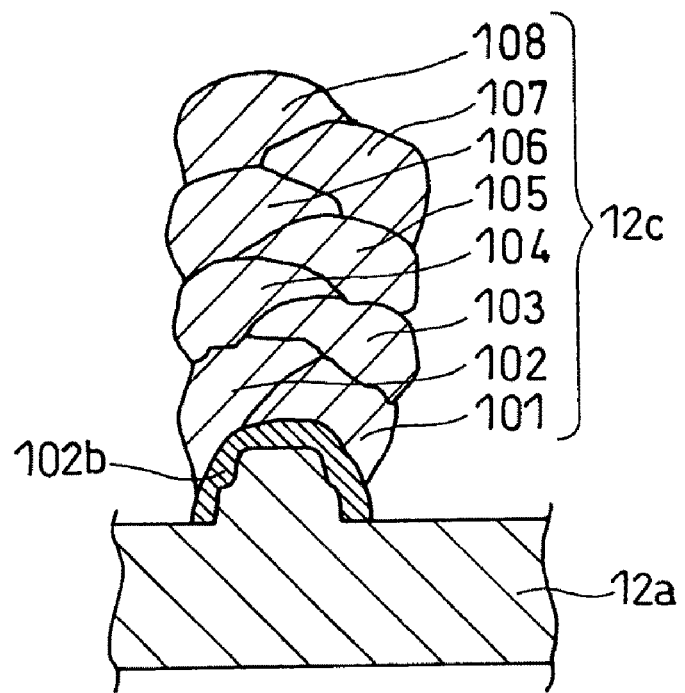
FIG. 4 is a schematic cross-sectional view of a columnar particle comprising a plurality of subparticles that are laminated and grown slantwise relative to the direction of the normal to the surface of a current collector.

The columnar particle illustrated in FIG. 4 includes a plurality of subparticles that are laminated and inclined relative to the direction of the normal to the surface of the current collector. A columnar particle 12c includes subparticles 101 to 108 that are inclined relative to the direction of the normal to the surface of the current collector. These subparticles are inclined in different directions. For example, the inclination direction d1 of the subparticle 101 in contact with the negative electrode intermediate layer 12b and the inclination direction d2 of the subparticle 102 in contact with the subparticle 101 are preferably symmetrical with respect to the plane perpendicular to the current collector 12a. Likewise, it is also preferable that mutually adjacent subparticles be symmetrical with respect to the plane perpendicular to the current collector 12a.

When the active material contains lithium which corresponds to irreversible capacity or does not contain lithium, the total thickness "t" of the active material layer and the intermediate layer is preferably, for example, $0.2\ \mu m \leq t \leq 100\ \mu m$ or $1\ \mu m \leq t \leq 50\ \mu m$, although it depends on the diameter of columnar particles. When the total thickness t of the active material layer and the intermediate layer is 0.1 μm or more, it is possible to secure energy density and utilize the high capacity inherent in lithium ion secondary batteries. When the total thickness t of the active material layer and the intermediate layer is 100 μm or less, the rate at which respective columnar particles are shielded by other columnar particles can be made low. Also, since the resistance to current collection from the columnar particles can be made low, such thickness is advantageous to high-rate charge/discharge.

The current collector comprises a metal capable of being alloyed with silicon. The metal capable of being alloyed with silicon is desirably copper or nickel. Copper or nickel is advantageous in that it is a metal that is not alloyed with lithium and is inexpensive. Preferably, the main surface of the current collector is visually flat but microscopically irregular.

The thickness of the current collector is preferably, for example, 1 μm to 50 μm. If the thickness is less than 1 μm, the resistance to current collection increases, so that the function of the current collector may be impaired. If the thickness is greater than 50 μm, the energy density of the electrode decreases.

The surface of the current collector carrying the intermediate layer desirably has asperities (i.e., protrusions and depressions). Specifically, the surface of the current collector carrying the intermediate layer desirably has 100,000 to 10,000,000 protrusions per square centimeters. A greater number of protrusions per unit area are more advantageous for increasing the number of columnar particles carried per unit area. However, the porosity P of the negative electrode tends to decrease. A smaller number of protrusions per unit area are more advantageous for decreasing the number of columnar particles carried per unit area. It is therefore desirable to control the number of protrusions per unit area of the current collector depending on the desired porosity P of the negative electrode.

The surface roughness (ten-point height) Rz of the main surface of the current collector carrying the intermediate layer is desirably 0.1 to 100 μm. If the surface roughness Rz is less than this range, it may be difficult to form space between mutually adjacent columnar particles. As the surface roughness Rz increases, the average thickness of the current collector increases. However, when Rz is 100 μm or less, the high capacity inherent in lithium ion secondary batteries can be adequately utilized. The surface roughness Rz can be measured by the method defined by Japanese Industrial Standards (JIS).

Preferably, the current collector is, for example, electrolytic copper foil, electrolytic copper alloy foil, electrolytic copper foil subjected to surface roughening treatment, or rolled copper foil subjected to surface roughening treatment. As used herein, surface roughening treatment refers to, for example, a treatment in which copper foil is immersed in a solution for partial chemical etching to produce asperities on the surface, or a treatment in which copper particles are electrolytically deposited on copper foil to produce asperities on the surface. According to these methods, asperities are formed randomly.

The main surface of the current collector carrying the intermediate layer preferably has asperities of a regular pattern. When the surface of the current collector has such asperities, the intermediate layer or the active material layer formed thereon becomes uniform, so that the quality of the electrode is stabilized.

Examples of methods for producing asperities on the surface of the current collector in a regular pattern include a method of etching or plating the current collector at regular positions by using a resist, and a method of pressing a die against the current collector to mechanically produce asperities. Formation of regular asperities is desirable in that the size of the columnar particles becomes uniform. While the columnar particles may be formed on either the depressions or the protrusions of the current collector, they are preferably formed on the protrusions in terms of forming space between adjacent columnar particles.

When the constituent element of the current collector diffuses into the intermediate layer to form a mixed layer, the mixed layer may contain at least one element X selected from the group consisting of chromium, carbon, and hydrogen. However, the content of the element X in the mixed layer is preferably 10 mol % or less of the copper in the mixed layer. Generally, chromium or an oil/fat component is applied to the surface of a current collector as an antirust treatment. Even if such a substance remains on the surface of the current collector, there is no particular problem with respect to the formation of the active material layer or battery characteristics. Hence, there is no problem even if the active material layer is formed without removing chromium or an oil/fat component. That is, there is no problem even if an antirust component (element X) such as chromium, carbon, or hydrogen is present at the interface between the current collector and the intermediate layer. If the content of the element X is greater than 10 mol %, an active material may be attached to the current collector less efficiently in forming an active material layer. Also, if the content of the element X is greater than 10 mol %, it does not contribute to improvement of the antirust effect. It is therefore preferable that the content of the element X be 10 mol % or less of the copper in the mixed layer.

The irreversible capacity loss of the active material layer may be compensated for by depositing lithium on the active material layer to cause a reaction between the lithium and the active material. Compensating for the irreversible capacity loss can provide a high capacity electrode.

A method for producing a negative electrode for a lithium ion secondary battery of the present invention includes, for example, the steps of: forming an intermediate layer including silicon and oxygen on a current collector comprising a metal capable of being alloyed with silicon; and forming an active material layer on the intermediate layer. When the composition of the intermediate layer is different from that of the active material layer, the boundary between the intermediate layer and the active material layer can be identified by analysis. When the composition of the intermediate layer is the same as that of the active material layer, it is difficult to clearly identify the boundary therebetween, but it is possible to identify the presence of the intermediate layer as the diffusion preventive layer which suppresses the diffusion of the constituent element of the current collector.

For example, in performing vacuum deposition by using silicon as the evaporation source, by introducing a very small amount of oxygen into a vacuum chamber, it is possible to form an intermediate layer including silicon and oxygen and an active material layer. The ratio of silicon to oxygen can be controlled by changing the relation between the flow rate of oxygen and the deposition speed of silicon. Likewise, in performing sputtering, by introducing a very small amount of oxygen into a vacuum chamber, it is possible to form an intermediate layer including silicon and oxygen and an active material layer.

Since the diffusion of the constituent element of the current collector into the intermediate layer including silicon and oxygen is unlikely to occur, the intermediate layer can be formed at high temperatures. For example, when at least one of the intermediate layer and the active material layer is formed, the temperature of the current collector can be set at 300° C. to 700° C.

If the temperature of the current collector is less than 300° C., the diffusion of the constituent element of the current collector can be suppressed, but the deposition speed cannot be increased, which may result in an increase in production costs. If the temperature of the current collector exceeds 700° C., the current collector is susceptible to deformation, which may interfere with continuous production.

In the present invention, for example, the deposition speed of the intermediate layer and the active material layer (the speed at which the thickness of the intermediate layer and the active material layer increases) can be set at 10 nm to 700 nm, or 100 nm to 600 nm per second.

Another method for producing a negative electrode for a lithium ion secondary battery of the present invention includes the step of depositing lithium on the active material layer in addition to the above-described steps.

In the present invention, when lithium is deposited on the active material layer to supplement lithium which corresponds to irreversible capacity, lithium can be deposited at high speeds. That is, upon deposition, the temperature of the current collector can be set at 300° C. to 700° C.

Still another method for producing a negative electrode for a lithium ion secondary battery of the present invention includes the step of heating the current collector, the intermediate layer, and the active material layer at the same time in addition to the above-described steps.

During or after the formation of the intermediate layer and the active material layer, or during the deposition of lithium on the active material layer, the negative electrode may curve due to internal stress of the active material layer. The internal stress can be relieved by heating the negative electrode at 300° C. to 700° C. When the heating temperature is less than 300° C., the internal stress cannot be relieved within a short period of time, so that the production efficiency may lower, resulting in an increase in production costs. If the heating temperature is more than 700° C., the current collector is susceptible to deformation, which may interfere with continuous production.

The intermediate layer and the active material layer can be formed by various methods. For example, they may be formed by vapor deposition, sputtering, chemical vapor deposition (CVD), etc. Among them, vapor deposition or sputtering is preferable. Examples of vapor deposition which can be selected include vacuum deposition, ion beam deposition, and electron beam deposition. An example of sputtering which can be selected is RF sputtering.

Since the present invention is characterized by the configuration of the negative electrode, other constituent elements of the lithium ion secondary battery than the negative electrode are not particularly limited.

Examples of positive electrode active materials include, but are not limited to, lithium-containing transition metal oxides such as lithium cobaltate ($LiCoO_2$), lithium nickelate ($LiNiO_2$), and lithium manganate ($LiMn_2O_4$). The constituent material of the positive electrode current collector can be, for example, aluminum, an aluminum alloy, nickel, or titanium.

The positive electrode active material layer may be composed only of a positive electrode active material or may be composed of a positive electrode material mixture containing other optional components than the positive electrode active material. Examples of optional components include a binder and a conductive agent. The positive electrode active material layer may also be composed of columnar particles just like the negative electrode active material layer.

With respect to the electrolyte, various solid and non-aqueous electrolytes having lithium ion conductivity can be used. A preferable non-aqueous electrolyte comprises a non-aqueous solvent and a lithium salt dissolved therein. The composition of the non-aqueous electrolyte is not particularly limited.

Also, the separator and the battery case are not particularly limited, and any materials in various forms for use in lithium ion secondary batteries can be used without any particular limitation.

The present invention is hereinafter described specifically by way of Examples. The following Examples, however, are not to be construed as limiting the present invention.

Example 1

A layered-type lithium ion secondary battery as illustrated in FIG. 1 was produced.
(i) Preparation of Positive Electrode
A positive electrode material mixture paste was prepared by fully mixing 10 g of lithium cobaltate ($LiCoO_2$) powder (positive electrode active material) with a mean particle size of approximately 10 μm, 0.3 g of acetylene black (conductive agent), 0.8 g of a polyvinylidene fluoride powder (binder), and a suitable amount of N-methyl-2-pyrrolidone (NMP). The paste was applied onto one face of an aluminum foil positive electrode current collector 11a with a thickness of 20 μm, dried, and rolled to form a positive electrode active material layer 11b. This was then cut into a predetermined shape to obtain a positive electrode. In the positive electrode, the positive electrode active material layer on one face of the aluminum foil had a thickness of 70 μm and a size of 30 mm×30 mm. A lead was connected to the backside of the current collector having no positive electrode active material layer.

(ii) Preparation of Negative Electrode

<Formation of Intermediate Layer>

A negative electrode 12 was prepared by using a vapor deposition device 40 (available from ULVAC, Inc.) with an electron beam (EB) heating means (not shown) as illustrated in FIG. 5. The vapor deposition device 40 was equipped with a gas pipe (not shown) for introducing oxygen gas into a vacuum chamber 41, and a nozzle 43. The nozzle 43 was connected to a pipe 44 which was introduced into the chamber 41. The pipe 44 was connected to an oxygen cylinder via a massflow controller. The oxygen cylinder was charged with an oxygen gas having a purity of 99.7% (available from Nippon Sanso Corporation). A support 42 for fixing a negative electrode current collector 12a was placed above the nozzle 43. A target 45 was placed below the support 42 in the direction vertical thereto. A silicon simple substance with a purity of 99.9999% (available from Kojundo Chemical Lab. Co., Ltd.) was used as the target 45.

To the support 42 was fixed an electrolytic copper foil with a thickness of 35 μm (available from Furukawa Circuit Foil Co., Ltd., surface roughness Rz=15 μm) which had been cut to a size of 40 mm×40 mm. The support 42 was placed horizontally such that the angle a between itself and a horizontal plane was 0°.

The acceleration voltage of an electron beam applied to the silicon target 45 was set to −8 kV and the emission was set to 500 mA. The oxygen flow rate was set to 80 sccm by using a massflow controller. The steam of silicon was passed through the oxygen atmosphere and deposited on the copper foil on the support 42 to form an intermediate layer 12b including silicon and oxygen. The deposition time was set to 10 seconds. The amount of oxygen contained in the intermediate layer obtained was quantified by a combustion method, and the result showed that the composition of the compound including silicon and oxygen was $SiO_{0.6}$. The thickness of the intermediate layer was 1 μm.

The combustion method as used herein refers to a quantification method in which a sample is heated in a graphite crucible and the amount of CO gas produced is measured by non-dispersive infrared spectroscopy to quantify the amount of oxygen contained in the sample. The quantification of oxygen by the combustion method can be made by using an oxygen analyzer (e.g., MEGA-620W available from Horiba, Ltd.).

<Formation of Active Material Layer>

Subsequently, with the copper foil with the intermediate layer placed on the support 42, a negative electrode active material layer 12c was formed at an oxygen flow rate of 40 sccm and a deposition time of 90 seconds. The thickness of the active material layer was 9 μm. The resultant negative electrode with the intermediate layer and the active material layer was designated as a negative electrode 1A.

In this example, after the formation of the intermediate layer, the temperature of the current collector was lowered to room temperature and the pressure of the chamber was raised to normal pressure, in order to quantify the amount of oxygen. As a result, the boundary between the intermediate layer and the active material layer was observed in a cross-section thereof.

<Measurement>

Under the same conditions as described above, a sample was prepared by forming only a negative electrode active material layer 12c on copper foil. Using the sample, the amount of oxygen contained in the negative electrode active material layer was quantified by the combustion method, and the result showed that the composition of the compound including silicon and oxygen was $SiO_{0.3}$.

When the intermediate layer and the active material layer were deposited, the temperature of the current collector was measured with a radiation thermometer, and the result showed that it was 320° C. in forming each of the two layers. Since the deposition speed is as high as 100 nm/s, the temperature of the current collector became 320° C. without heating it. When the temperature of the current collector is too high, the current collector may be cooled. An example of the cooling method is a method of bringing a copper pipe into contact with the support of the current collector and supplying a coolant into the copper pipe. When the current collector is heated, a heater may be installed, for example, on the support.

<Deposition of Lithium>

Next, using a resistance heating vapor deposition device available from ULVAC, Inc., lithium metal was deposited on the active material layer of the negative electrode 1A. A tantalum boat in the vapor deposition device was charged with a predetermined amount of lithium metal, and the active material layer of the negative electrode 1A was fixed so as to face the boat. With the value of the current passed through the boat being set to 50 A, deposition was carried out for 10 minutes. By this operation, lithium metal was deposited to supplement the intermediate layer and the negative electrode active material layer with lithium in an amount corresponding to the irreversible capacity loss in the initial charge/discharge cycle. Thereafter, the negative electrode 1A was cut to a size of 31 mm×31 mm, and a lead was connected to the backside of the current collector having no negative electrode active material layer.

When the lithium was deposited, the temperature of the current collector was measured with a radiation thermometer, and the result showed that it was 350° C.

(iii) Production of Test Battery

The positive electrode active material layer 11b of the positive electrode 11 was opposed to the negative electrode active material layer 12c of the negative electrode 12, with a separator 13 interposed therebetween, to form a thin electrode assembly. The separator used was a 20-μm-thick polyethylene micro-porous film available from Asahi Kasei Corporation. This electrode assembly was inserted, together with a non-aqueous electrolyte, into a battery case 14 made of an aluminum laminate sheet. The non-aqueous electrolyte used was prepared by dissolving $LiPF_6$ at a concentration of 1 mol/L in a solvent mixture of ethylene carbonate (EC) and ethyl methyl carbonate (EMC) in a volume ratio 1:1.

The positive electrode 11, the negative electrode 12, and the separator 13 were impregnated with the non-aqueous electrolyte, and a positive electrode lead 15 and a negative electrode lead 16 were drawn out of the battery case 14. In this state, while evacuating the battery case 14, the ends of the battery case 14 were melted and adhered together to complete a test battery. This test battery was designated as a battery 1A.

Comparative Example 1

A negative electrode was produced in the following manner.

Deposition was carried out by using the same copper foil and vapor deposition device as those of Example 1.

Copper foil was fixed to the support 42, and the copper foil was positioned horizontally such that the angle between the support and a horizontal plane was 0°. The acceleration voltage of the electron beam applied to the silicon target 45 was set to −8 kV and the emission was set to 500 mA. Without introducing oxygen into the vacuum chamber 41, an active material layer made of silicon was formed on the copper foil on the support 42. The deposition time was set to 70 seconds. The negative electrode thus obtained was designated as a negative electrode 1B.

When the active material layer was deposited, the temperature of the current collector was measured with a radiation thermometer, and the result showed that it was 330° C.

The amount of oxygen contained in the active material layer was quantified by the combustion method, and the result showed that the oxygen content was 1 mol % or less. The thickness of the active material layer was 7 μm. Lithium was not deposited on the active material layer of the negative electrode 1B.

A test battery 1B was produced in the same manner as in Example 1 except for the use of the negative electrode 1B.

[Analysis of Negative Electrode]

The intermediate layer and active material layer of the negative electrode 1A and the active material layer of the negative electrode 1B were analyzed in the depth direction by X-ray photoelectron spectroscopy. The analysis was performed to obtain the relation between the depth from a predetermined position of the active material layer or the intermediate layer and the ratio of copper. The ratio of copper as used herein is the molar percentage of copper relative to all the elements detected in the analyzed area. Since the elements detected in the analyzed area are Cu, Si, and O, the ratio of copper is the number of moles of Cu relative to the total number of moles of Cu, Si, and O, i.e., Cu/(Cu+Si+O).

It should be noted that the above-described analysis was performed on a negative electrode 1A' and a negative electrode 1B' that were prepared from a highly-flat, rolled copper foil (surface roughness Rz=0.7 μm or less) under the same conditions as those for the negative electrodes 1A and 1B. It should also be noted that in the following Examples, unless otherwise specified, depth-direction analyses were performed on electrodes that were prepared from rolled copper foil current collectors in the same manner.

Figure 6A:
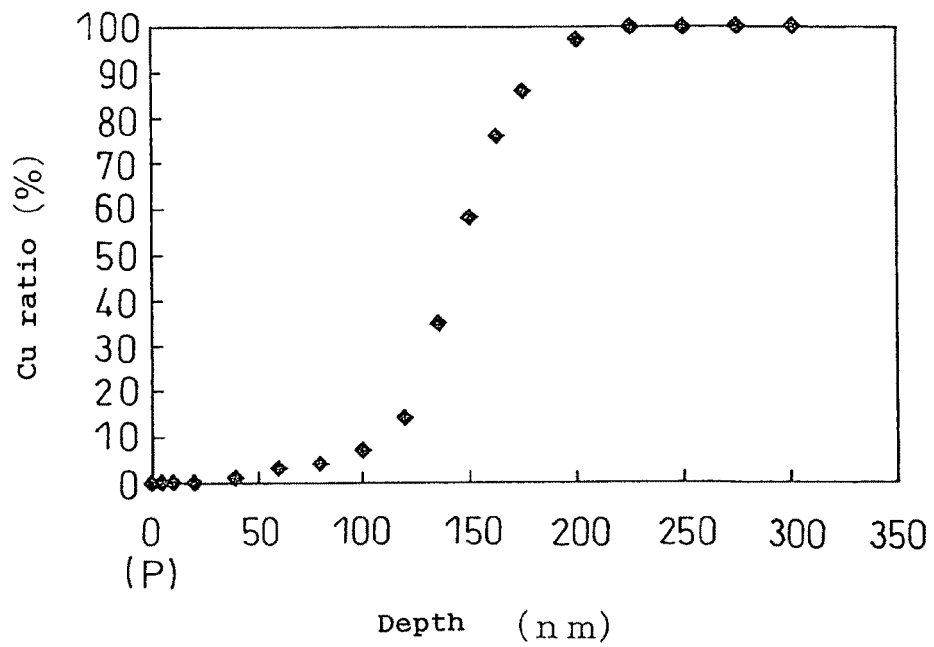
FIG. 6A shows the result of an X-ray photoelectron spectroscopic analysis of a negative electrode for a lithium ion secondary battery according to an Example of the present invention.
Figure 6B:
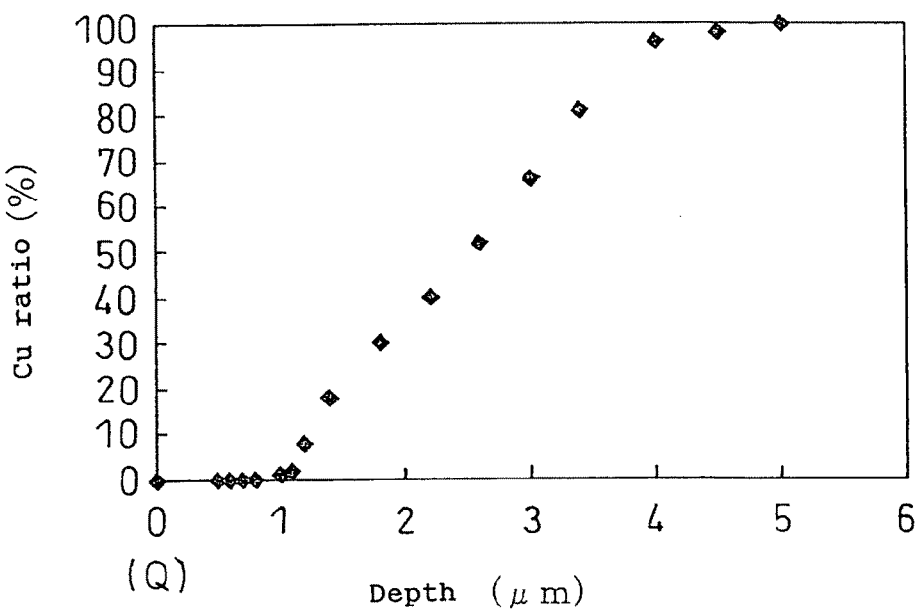
FIG. 6B shows the result of an X-ray photoelectron spectroscopic analysis of a negative electrode for a lithium ion secondary battery according to a Comparative Example of the present invention.

FIG. 6A shows the result of the analysis of the negative electrode 1A', and FIG. 6B shows the result of the analysis of the negative electrode 1B'. In FIG. 6A, the abscissa of the graph represents the depth from a predetermined position P of the intermediate layer toward the current collector, with the predetermined position P being the depth 0 nm. In FIG. 6B, the abscissa of the graph represents the depth from a predetermined position Q of the active material layer toward the current collector, with the predetermined position Q being the depth 0 μm.

The ordinate represents the copper ratio (Cu/Cu+Si+O). In the negative electrode 1A', the diffusion width of copper is narrow and the change is sharp. Contrary to this, in the negative electrode 1B', the diffusion width of copper is wide and the change is gradual. This result shows that in the negative electrode 1B'(negative electrode 1B), copper is widely diffused into the active material layer.

According to such a measurement method, even if there is no diffusion region, a diffusion width as shown in FIG. 6 is measured due to minute asperities of a current collector or depending on a measurement device used. It is thus not clear whether the diffusion width actually represents the presence of a mixed layer formed by the diffusion of copper into the intermediate layer. However, it is believed that relative evaluation is possible by using the same current collector and the same measurement device. As used herein, "diffusion width" is defined as the thickness of a mixed layer with a copper ratio of 10 mol % to 90 mol %.

In Examples and Comparative Examples, the diffusion width was determined by X-ray photoelectron spectroscopy unless otherwise specified.

Table 1 summarizes the physical properties of the respective negative electrodes.

TABLE 1

|  | Negative electrode 1A | Negative electrode 1B |
|---|---|---|
| Composition of intermediate layer | $SiO_{0.6}$ | — |
| Composition of active material layer | $SiO_{0.3}$ | Si |
| Diffusion width | 50 nm | 2.3 μm |
| Thickness of intermediate layer | 1 μm | — |
| Thickness of active material layer | 9 μm | 7 μm |

[Evaluation Method]

The batteries 1A and 1B were placed in a constant temperature room at 20° C. and charged by the constant-current and constant-voltage method. That is, the batteries were charged at a constant current of 1 C rate (1 C is the current value at which the whole battery capacity can be used in 1 hour) until the battery voltage reached 4.2 V. The batteries were then charged at the constant voltage of 4.2 V until the current value reached 0.05 C. After the charge, the batteries were allowed to stand for 20 minutes and then discharged at a constant current of 0.2 C until the battery voltage reached 2.5 V. After the discharge, the batteries were allowed to stand for 20 minutes.

This charge/discharge cycle was repeated 100 times.

The percentage of the discharge capacity at the 100$^{th}$ cycle relative to the discharge capacity at the initial cycle was obtained as the capacity retention rate. After 100 cycles, the battery 1A and the battery 1B were disassembled, and the intermediate layer or active material layer of the negative electrode 1A and the negative electrode 1B was observed with a microscope. Table 2 shows the results.

[Evaluation Results]

TABLE 2

|  | Capacity retention rate | Observation of negative electrode |
|---|---|---|
| Battery 1A | 90% | Active material layer was not separated |
| Battery 1B | 55% | Active material layer was separated |

As shown by Table 2, the cycle characteristic of the battery 1A was significantly superior to that of the battery 1B. The battery 1A after 100 cycles was disassembled and the negative electrode 1A was observed, and the result showed no separation of the intermediate layer and the active material layer from the copper foil. On the other hand, the battery 1B after 100 cycles was disassembled and the negative electrode 1B was observed, and the result showed that the active material layer was partially separated from the copper foil.

[Consideration]

In the case of the battery 1A, the active material layer was deposited at 300° C. or more. However, the intermediate layer was believed to suppress the diffusion of copper (the constituent element of the current collector), thereby preventing the interface between the current collector and the intermediate layer from becoming brittle. Probably for this reason, even after 100 charge/discharge cycles, the intermediate layer and the active material layer did not separate from the current collector, so that current collection was ensured and the cycle characteristic was improved. The diffusion width of copper was 50 nm, which was very small, but sufficient adhesion strength was ensured.

In the case of the battery 1B, a large amount of copper diffused into the active material layer because of the absence of the intermediate layer, so the diffusion width of copper was 2.3 μm. Probably for this reason, the interface between the current collector and the active material layer became brittle. Hence, when the active material layer expanded during the charge/discharge cycles, the active material layer separated due to stress, thereby resulting in poor current collection and deteriorated cycle characteristic.

Example 2

A comparison was made between the case of forming an intermediate layer made of Mo and the case of forming an intermediate layer including silicon and oxygen. In order to compare negative electrode capacity, test cells were produced by using lithium metal as a counter electrode.

(i) Preparation of Counter Electrode

A 0.3-mm-thick lithium metal foil was cut into a square of 32 mm, and a lead was connected to the edge thereof.

(ii) Production of Test Battery

The negative electrode 1A of Example 1 was used as the negative electrode. Lithium was not deposited on the active material layer.

The counter electrode made of the lithium metal foil was opposed to the negative electrode active material layer 12c of the negative electrode 12, with a separator 13 interposed therebetween, to form a thin electrode assembly. The separator used was a 20-μm-thick polyethylene micro-porous film available from Asahi Kasei Corporation. This electrode assembly was inserted, together with a non-aqueous electrolyte, into a battery case 14 made of an aluminum laminate sheet. The non-aqueous electrolyte used was prepared by dissolving $LiPF_6$ at a concentration of 1 mol/L in a solvent mixture of ethylene carbonate (EC) and ethyl methyl carbonate (EMC) in a volume ratio 1:1.

The counter electrode, the negative electrode 12, and the separator 13 were impregnated with the non-aqueous electrolyte, and the counter electrode lead and the negative electrode lead 16 were drawn out of the battery case 14. In this state, while evacuating the battery case 14, the ends of the battery case 14 were melted and adhered together to complete a test battery. This test battery was designated as a battery 2A.

Comparative Example 2

A negative electrode was produced in the following manner.

First, a molybdenum thin film serving as the intermediate layer was formed on the same copper foil as that of Example 1 by using an RF magnetron sputtering device.

Molybdenum with a diameter of 4 inches and a thickness of 5 mm was used as the target. Argon gas was introduced into a vacuum chamber at a flow rate of 100 sccm, and the pressure inside the chamber was adjusted to 20 mTorr. With the output of a high frequency power source set to 100 W, sputtering was performed for 60 minutes. The molybdenum thin film obtained had a thickness of 1 μm.

Next, an active material was deposited on the intermediate layer by using the same vapor deposition device as that of Example 1.

The copper foil with the molybdenum thin film was fixed to the support 42, and the copper foil was positioned horizontally such that the angle α between the support and a horizontal plane was 0°. The acceleration voltage of the electron beam applied to the silicon target 45 was set to −8 kV and the emission was set to 500 mA. The oxygen flow rate was set to 40 sccm and the deposition time was set to 90 seconds. Under these conditions, a negative electrode active material layer 12c was formed. The negative electrode thus obtained was designated as a negative electrode 2B.

A test battery 2B was produced in the same manner as in Example 2 except for the use of the negative electrode 2B. Lithium was not deposited on the active material layer.

Table 3 summarizes the physical properties of the negative electrode 2B.

TABLE 3

|  | Negative electrode 2B |
| --- | --- |
| Composition of intermediate layer | Mo |
| Composition of active material layer | $SiO_{0.3}$ |
| Diffusion width | 53 nm |
| Thickness of intermediate layer | 1 μm |
| Thickness of active material layer | 9 μm |

[Evaluation Method]

The batteries 2A and 2B were placed in a constant temperature room at 20° C. and charged at a constant current of 0.2 C rate (1 C is the current value at which the whole battery capacity can be used in 1 hour) until the battery voltage reached 0 V. The batteries were allowed to stand for 20 minutes and then discharged at a constant current of 0.2 C until the battery voltage reached 1.5 V. After the discharge, the batteries were allowed to stand for 20 minutes.

This charge/discharge cycle was repeated 30 times.

The percentage of the discharge capacity at the $100^{th}$ cycle relative to the discharge capacity at the initial cycle was obtained as the capacity retention rate. After 100 cycles, the battery 2A and the battery 2B were disassembled, and the intermediate layer or active material layer of the negative electrode 2A and the negative electrode 2B was observed with a microscope. Table 4 shows the results.

TABLE 4

|  | Discharge capacity at $1^{st}$ cycle | Capacity retention rate | Observation of negative electrode |
| --- | --- | --- | --- |
| Battery 2A | 35 mAh | 85% | Active material layer was not separated |
| Battery 2B | 30 mAh | 84% | Active material layer was not separated |

As shown by Table 4, the battery 2A exhibited a higher discharge capacity than the battery 2B. In the battery 2A, since the intermediate layer including silicon and oxygen functions as the active material, the total of the capacity of the intermediate layer and the capacity of the active material layer was obtained. The capacity of the battery 2B was low because Mo of the intermediate layer is not alloyed with lithium (the intermediate layer does not contribute to capacity). The capacity retention rates and the appearances of the negative electrodes of these batteries were equivalent.

Example 3

When the intermediate layer including silicon and oxygen is represented by $SiO_x$, the range of x was examined.

The following negative electrodes 3A to 3E were produced in the same manner as in Example 1, except that in forming an intermediate layer, the oxygen flow rate and the deposition time were changed. Also, test batteries 3A to 3E were produced in the same manner as in Example 1 except for the use of the negative electrodes 3A to 3E. When the intermediate layer of each of these negative electrodes was formed, the temperature of the current collector was 320° C. Lithium was deposited on the active material layer in the same manner as in Example 1.

<i> Negative Electrode 3A

A negative electrode 3A was produced in the same manner as in Example 1, except that in forming an intermediate layer, deposition was performed by setting the oxygen flow rate to 5 sccm and setting the deposition time to 20 seconds. A test battery 3A was produced in the same manner as in Example 1 except for the use of the negative electrode 3A.

<ii> Negative Electrode 3B

A negative electrode 3B was produced in the same manner as in Example 1, except that in forming an intermediate layer, deposition was performed by setting the oxygen flow rate to 10 sccm. A test battery 3B was produced in the same manner as in Example 1 except for the use of the negative electrode 3B.

<iii> Negative Electrode 3C

A negative electrode 3C was produced in the same manner as in Example 1, except that in forming an intermediate layer, deposition was performed by setting the oxygen flow rate to 40 sccm. A test battery 3C was produced in the same manner as in Example 1 except for the use of the negative electrode 3C.

<iv> Negative Electrode 3D

A negative electrode 3D was produced in the same manner as in Example 1, except that in forming an intermediate layer, deposition was performed by setting the oxygen flow rate to 130 sccm. A test battery 3D was produced in the same manner as in Example 1 except for the use of the negative electrode 3D.

<v> Negative Electrode 3E

A negative electrode 3E was produced in the same manner as in Example 1, except that in forming an intermediate layer, deposition was performed by setting the oxygen flow rate to 240 sccm. A test battery 3E was produced in the same manner as in Example 1 except for the use of the negative electrode 3E.

<vi> Negative Electrode 3F

A negative electrode 3F was produced in the same manner as in Example 1, except that in forming an intermediate layer, deposition was performed by using $SiO_2$ as the target and setting the oxygen flow rate to 100 sccm. A test battery 3F was produced in the same manner as in Example 1 except for the use of the negative electrode 3F.

Table 5 summarizes the physical properties of the negative electrodes 3A to 3F.

TABLE 5

|  | Negative electrode 3A | Negative electrode 3B | Negative electrode 3C | Negative electrode 3D | Negative electrode 3E | Negative electrode 3F |
| --- | --- | --- | --- | --- | --- | --- |
| Composition of intermediate layer | $SiO_{0.05}$ | $SiO_{0.1}$ | $SiO_{0.3}$ | $SiO_{1.0}$ | $SiO_{1.5}$ | $SiO_2$ |
| Composition of active material layer | $SiO_{0.3}$ | $SiO_{0.3}$ | $SiO_{0.3}$ | $SiO_{0.3}$ | $SiO_{0.3}$ | $SiO_{0.3}$ |
| Diffusion width | 1.2 μm | 0.1 μm | 53 nm | 50 nm | 46 nm | 41 nm |
| Thickness of intermediate layer | 2 μm | 1 μm | 1 μm | 1 μm | 1 μm | 1 μm |
| Thickness of active material layer | 9 μm | 9 μm | 9 μm | 9 μm | 9 μm | 9 μm |

The capacity retention rates of the batteries 3A to 3F were measured in the same manner as described above. The negative electrodes 3A to 3F after 100 cycles were observed in the same manner as described above. Table 6 shows the results.

TABLE 6

|  | Capacity retention rate | Observation of negative electrode |
| --- | --- | --- |
| Battery 3A | 70% | Active material layer was partially separated |
| Battery 3B | 81% | Active material layer was not separated |
| Battery 3C | 90% | Active material layer was not separated |
| Battery 3D | 91% | Active material layer was not separated |
| Battery 3E | 90% | Active material layer was not separated |
| Battery 3F | — | Active material layer was not separated |

As shown by Table 6, in the case of the battery 3A with the $SiO_{0.05}$ intermediate layer, the cycle characteristic was slightly inferior. Also, since the ratio of oxygen in the intermediate layer is low, the diffusion width of copper was more than 1 μm. In the battery 3A, it is believed that the diffusion of a relatively large amount of copper made the interface between the copper and the intermediate layer brittle. On the other hand, the batteries 3B to 3E exhibited good cycle characteristics and no separation of the active material layers. In particular, in the case of the batteries 3D to 3E where the value x of the intermediate layer is greater than that of the active material layer, it is believed that the separation of the active material layer was effectively suppressed, and the cycle characteristic was good. The battery 3F did not charge or discharge, probably because $SiO_2$ is an insulator.

Example 4

The temperature of the current collector during the formation of the intermediate layer and the active material layer was examined.

The intermediate layer and the active material layer were formed by using the same vapor deposition device as that of Example 1.

The following negative electrodes 4A to 4D were produced in the same manner as in Example 1, except that the base plate of the support 42 of FIG. 5 was provided with a heating means and a cooling means (not shown) for controlling the temperature thereof and that the temperature of the base plate was varied from room temperature to 800° C. Also, test batteries 4A to 4D were produced in the same manner as in Example 1 except for the use of the negative electrodes 4A to 4D. Lithium was deposited on the active material layer in the same manner as in Example 1.

<i> Negative Electrode 4A

In forming an intermediate layer, the temperature of the base plate was set to 200° C., the emission of the electron beam to 100 mA, the deposition time to 200 seconds, and the oxygen flow rate to 4 sccm. Further, in forming an active material layer, the temperature of the base plate was set to 200° C., the emission of the electron beam to 100 mA, the deposition time to 30 minutes, and the oxygen flow rate to 2 sccm. A negative electrode 4A was produced in the same manner as in Example 1 except for these conditions. Using the negative electrode 4A, a test battery 4A was produced in the same manner as in Example 1. It should be noted that the temperature of the base plate can be regarded as the same as that of the current collector. This also applies to the following negative electrodes 4B to 4D.

<ii> Negative Electrode 4B

In forming an intermediate layer, the temperature of the base plate was set to 300° C., the emission of the electron beam to 250 mA, the deposition time to 10 seconds, and the oxygen flow rate to 8 sccm. Further, in forming an active material layer, the temperature of the base plate was set to 300° C., the emission of the electron beam to 250 mA, the deposition time to 15 minutes, and the oxygen flow rate to 4 sccm. A negative electrode 4B was produced in the same manner as in Example 1 except for these conditions. Using the negative electrode 4B, a test battery 4B was produced in the same manner as in Example 1.

<iii> Negative Electrode 4C

In forming an intermediate layer, the temperature of the base plate was set to 700° C., the emission of the electron beam to 600 mA, the deposition time to 1.4 seconds, and the oxygen flow rate to 500 sccm. Further, in forming an active material layer, the temperature of the base plate was set to 700° C., the emission of the electron beam to 600 mA, the deposition time to 13 seconds, and the oxygen flow rate to 280 sccm. A negative electrode 4C was produced in the same manner as in Example 1 except for these conditions. Using the negative electrode 4C, a test battery 4C was produced in the same manner as in Example 1.

<iv> Negative Electrode 4D

In forming an intermediate layer, the temperature of the base plate was set to 750° C., the emission of the electron beam to 650 mA, the deposition time to 1.3 seconds, and the oxygen flow rate to 530 sccm. Further, in forming an active material layer, the temperature of the base plate was set to 750° C., the emission of the electron beam to 650 mA, the deposition time to 12 seconds, and the oxygen flow rate to 320 sccm. A negative electrode 4D was produced in the same manner as in Example 1 except for these conditions. Using the negative electrode 4D, a test battery 4D was produced in the same manner as in Example 1.

Table 7 summarizes the physical properties of the negative electrodes 4A to 4D.

TABLE 7

|  | Negative electrode 4A | Negative electrode 4B | Negative electrode 4C | Negative electrode 4D |
|---|---|---|---|---|
| Composition of intermediate layer | $SiO_{0.6}$ | $SiO_{0.6}$ | $SiO_{0.6}$ | $SiO_{0.6}$ |
| Composition of active material layer | $SiO_{0.3}$ | $SiO_{0.3}$ | $SiO_{0.3}$ | $SiO_{0.3}$ |
| Diffusion width | 49 nm | 51 nm | 55 nm | 1.2 μm |
| Thickness of intermediate layer | 1 μm | 1 μm | 1 μm | 1 μm |
| Thickness of active material layer | 9 μm | 9 μm | 9 μm | 9 μm |
| Deposition speed of intermediate layer and active material layer | 5 nm/seconds | 10 nm/seconds | 700 nm/seconds | 750 nm/seconds |

The capacity retention rates of the batteries 4A to 4D were measured in the same manner as described above. The negative electrodes 4A to 4D after 100 cycles were observed in the same manner as described above. Table 8 shows the results.

TABLE 8

|  | Capacity retention rate | Observation of negative electrode |
|---|---|---|
| Battery 4A | 91% | Active material layer was not separated |
| Battery 4B | 90% | Active material layer was not separated |
| Battery 4C | 87% | Active material layer was not separated |
| Battery 4D | 75% | Active material layer was partially separated |

As shown by Table 8, in the battery 4D, the cycle characteristic was slightly inferior to those of the batteries 4A to 4C, and the active material layer was partially separated. Also, the diffusion width of copper was more than 1 μm. In the battery 4D, the diffusion of a relatively large amount of copper was believed to make the interface between the copper and the intermediate layer brittle, thereby causing the active material layer to become partially separated and resulting in a decrease in conductivity. On the other hand, the batteries 4A to 4C provided good cycle characteristics.

However, in the case of the battery 4A, in order to control the temperature of the base plate at 200° C., it is necessary to lower the emission of the electron beam and reduce the deposition speed, in view of the cooling speed of the base plate. Thus, in forming the intermediate layer and the active material layer, the battery 4A required a time five times longer than the battery 4B or the battery 4C. In this way, when the temperature of the base plate is low, the productivity decreases.

To enhance the productivity, it is preferable to set the temperature of the base plate at 300° C. or more. On the other hand, if the temperature of the base plate is higher than 700° C., the deposition speed increases, but the diffusion of copper slightly increases. Hence, the temperature of the base plate during the deposition of the intermediate layer and the active material layer is desirably 300° C. or more and 700° C. or less. When the temperature of the base plate is in this range, the deposition speed is 10 nm to 700 nm.

Example 5

When a heat treatment is applied after the formation of the active material layer, the appropriate temperature range of the heat treatment was examined.

Negative electrodes 5A to 5E were produced in the same manner as in Example 1, except that after the formation of the active material layer, a heat treatment was applied at various temperatures before the deposition of lithium. Such a heat treatment may be performed to remove water on the electrode plate or remove the remaining stress in the current collector and the active material layer.

Also, when lithium is deposited on the active material layer to compensate the irreversible capacity loss during the initial charge/discharge cycle, the temperature of the base plate may rise due to heat of solidification of lithium or heat radiated by the device. That is, since the temperature of the base plate may rise during the lithium deposition in the same manner as in a heat treatment, the appropriate temperature range during the lithium deposition greatly affects the production process.

The heat treatment after the lithium deposition is performed to homogenize the reaction between lithium and the active material layer or remove the remaining stress in the active material layer which has expanded a little.

In this example, a heat treatment was applied before the lithium deposition, but even when the temperature of the base plate rises during the lithium deposition or a heat treatment is applied after the lithium deposition, the diffusion of copper can be prevented in the same manner.

<i> Negative Electrode 5A

The negative electrode 1A prepared in the same manner as in Example 1 was placed in a quartz pipe installed in a tubular furnace, and heat-treated at 200° C. for 10 minutes while supplying argon at a flow rate of 1000 sccm. The negative electrode thus obtained was designated as a negative electrode 5A. Using the negative electrode 5A, a test battery 5A was produced in the same manner as in Example 1.

<ii> Negative Electrode 5B

The negative electrode 1A prepared in the same manner as in Example 1 was placed in a quartz pipe installed in a tubular furnace, and heat-treated at 300° C. for 10 minutes while supplying argon at a flow rate of 1000 sccm. The negative electrode thus obtained was designated as a negative electrode 5B. Using the negative electrode 5B, a test battery 5B was produced in the same manner as in Example 1.

<iii> Negative Electrode 5C

The negative electrode 1A prepared in the same manner as in Example 1 was placed in a quartz pipe installed in a tubular furnace, and heat-treated at 700° C. for 10 minutes while supplying argon at a flow rate of 1000 sccm. The negative electrode thus obtained was designated as a negative electrode 5C. Using the negative electrode 5C, a test battery 5C was produced in the same manner as in Example 1.

<iv> Negative Electrode 5D

The negative electrode 1A prepared in the same manner as in Example 1 was placed in a quartz pipe installed in a tubular furnace, and heat-treated at 800° C. for 10 minutes while supplying argon at a flow rate of 1000 sccm. The negative electrode thus obtained was designated as a negative electrode 5D. Using the negative electrode 5D, a test battery 5D was produced in the same manner as in Example 1.

The negative electrodes 5A to 5D were placed on a flat surface and the greatest height of their curve was measured with a height gauge. The greatest height obtained was defined as warpage. Warpage serves as an indicator of internal stress. Table 9 summarizes the physical properties of the negative electrodes 5A to 5D.

TABLE 9

|  | Negative electrode 5A | Negative electrode 5B | Negative electrode 5C | Negative electrode 5D |
|---|---|---|---|---|
| Composition of intermediate layer | $SiO_{0.6}$ | $SiO_{0.6}$ | $SiO_{0.6}$ | $SiO_{0.6}$ |
| Composition of active material layer | $SiO_{0.3}$ | $SiO_{0.3}$ | $SiO_{0.3}$ | $SiO_{0.3}$ |
| Diffusion width | 45 nm | 49 nm | 200 nm | 1.1 μm |
| Thickness of intermediate layer | 1 μm | 1 μm | 1 μm | 1 μm |
| Thickness of active material layer | 9 μm | 9 μm | 9 μm | 9 μm |
| Warpage | 5 mm | 0 mm | 2 mm | 6 mm |

The capacity retention rates of the batteries 5A to 5D were measured in the same manner as described above. The negative electrodes 5A to 5D after 100 cycles were observed in the same manner as described above. Table 10 shows the results.

TABLE 10

|  | Capacity retention rate | Observation of negative electrode |
|---|---|---|
| Battery 5A | 90% | Active material layer was not separated |
| Battery 5B | 92% | Active material layer was not separated |
| Battery 5C | 89% | Active material layer was not separated |
| Battery 5D | 71% | Active material layer was partially separated |

As shown by Table 10, in the battery 5D, the cycle characteristic was slightly inferior to those of the batteries 5A to 5C, and the active material layer was partially separated. Also, the diffusion width of copper was more than 1 μm. In the battery 5D, the diffusion of a relatively large amount of copper was believed to make the interface between the copper and the intermediate layer brittle, thereby causing the active material layer to become partially separated and resulting in a decrease in conductivity. On the other hand, the batteries 5A to 5C exhibited good cycle characteristics.

As shown by Table 9, the negative electrode 5A exhibited a large warpage. This is probably because the remaining stress was not removed due to the low heat-treatment temperature. The negative electrode 5D exhibited the largest warpage. This is probably because the high heat-treatment temperature caused the copper base plate to soften and stretch unnecessarily. The above results indicate that the heat-treatment temperature is desirably 300° C. or more and 700° C. or less.

Example 6

The thickness of the intermediate layer appropriate for suppressing the diffusion of the constituent element of the current collector was examined.

The intermediate layer was formed by changing the emission of the electron beam, the oxygen flow rate, and the deposition time. As the active material layer, a layer made of silicon was formed in order to facilitate the diffusion of copper. Negative electrodes 6A to 6D were produced in the same manner as in Example 1 except for these conditions. Lithium was deposited on the active material layer in the same manner as in Example 1.

<i> Negative Electrode 6A

An intermediate layer was formed by setting the emission of the electron beam to 100 mA, the oxygen flow rate to 5 sccm, and the deposition time to 10 seconds. An active material layer was formed without introducing oxygen. When each of the intermediate layer and the active material layer was formed, the temperature of the base plate (current collector) was 200° C. A negative electrode was produced in the same manner as in Example 1 except for these conditions. The negative electrode obtained was placed in a quartz pipe installed in a tubular furnace, and heat-treated at 500° C. for 10 minutes while supplying argon at a flow rate of 1000 sccm. The negative electrode thus obtained was designated as a negative electrode 6A. Using the negative electrode 6A, a test battery 6A was produced in the same manner as in Example 1.

<ii> Negative Electrode 6B

An intermediate layer was formed by setting the emission of the electron beam to 100 mA, the oxygen flow rate to 5 sccm, and the deposition time to 20 seconds. When the intermediate layer was formed, the temperature of the current collector was 200° C. An active material layer was formed without introducing oxygen. A negative electrode was produced in the same manner as in Example 1 except for these conditions. The negative electrode obtained was placed in a quartz pipe installed in a tubular furnace, and heat-treated at 500° C. for 10 minutes while supplying argon at a flow rate of 1000 sccm. The negative electrode thus obtained was designated as a negative electrode 6B. Using the negative electrode 6B, a test battery 6B was produced in the same manner as in Example 1.

<iii> Negative Electrode 6C

An intermediate layer was formed by setting the emission of the electron beam to 100 mA, the oxygen flow rate to 5 sccm, and the deposition time to 100 seconds. When the intermediate layer was formed, the temperature of the current collector was 200° C. An active material layer was formed without introducing oxygen. A negative electrode was produced in the same manner as in Example 1 except for these conditions. The negative electrode obtained was placed in a quartz pipe installed in a tubular furnace, and heat-treated at 500° C. for 10 minutes while supplying argon at a flow rate of 1000 sccm. The negative electrode thus obtained was designated as a negative electrode 6C. Using the negative electrode 6C, a test battery 6C was produced in the same manner as in Example 1.

Table 11 summarizes the physical properties of the negative electrodes 6A to 6C.

TABLE 11

| | Negative electrode 6A | Negative electrode 6B | Negative electrode 6C |
|---|---|---|---|
| Composition of intermediate layer | $SiO_{0.6}$ | $SiO_{0.6}$ | $SiO_{0.6}$ |
| Composition of active material layer | Si | Si | Si |
| Diffusion width | 860 nm | 49 nm | 51 nm |
| Thickness of intermediate layer | 40 nm | 100 nm | 500 nm |
| Thickness of active material layer | 9 μm | 9 μm | 9 μm |

As shown by Table 11, the diffusion width of the negative electrode 6A was greater than those of the negative electrodes 6B to 6C. This is probably because the intermediate layer is slightly thin and does not cover the whole surface of the current collector. The diffusion widths of the negative electrodes 6B to 6C were equivalent to those of Example 1. These results indicate that the thickness of the intermediate layer is preferably 100 nm or more. It should be noted, however, that even when the thickness of the intermediate layer is less than 100 nm, the diffusion of copper is suppressed if the surface of the current collector is highly flat or a dense intermediate layer is formed.

Example 7

Various active materials were examined. Lithium was deposited on the active material layer in the same manner as in Example 1.

<i> Negative Electrode 7A

In forming a negative electrode active material, the target 45 was divided into two. Granular Si available from Kojundo Chemical Lab. Co., Ltd. was used as one of the targets while granular Ti available from Kojundo Chemical Lab. Co., Ltd. was used as the other target. The oxygen flow rate was set to 0 sccm, and the emission of the electron beam was set to 300 mA. Deposition was performed for 7 minutes by alternately irradiating the granular Si and the granular Ti with the electron beam to melt them separately. Except for this, in the same manner as in Example 1, a negative electrode 7A was produced. The active material layer obtained was analyzed by fluorescent X-ray spectroscopy, and the result showed that the composition of the active material (alloy) was $SiTi_{0.2}$. Using the negative electrode 7A, a test battery 7A was produced in the same manner as in Example 1. When the active material layer was formed, the temperature of the base plate (current collector) was 300° C.

<ii> Negative Electrode 7B

In forming a negative electrode active material, crystalline silicon available from Kojundo Chemical Lab. Co., Ltd. was used as the target 45 and nitrogen was introduced into the chamber instead of oxygen. The acceleration voltage of the electron beam applied to the target 45 was set to −8 kV, the emission to 300 mA, and the deposition time to 7 minutes. Except for such deposition, in the same manner as in Example 1, a negative electrode 7B was produced. When the active material layer was formed, the temperature of the base plate (current collector) was 300° C.

The nitrogen gas used was a nitrogen gas with a purity of 99.7% (available from Nippon Sanso Corporation), and the flow rate of nitrogen was set to 20 sccm. Also, an EB irradiation device was installed near the nozzle 43. With the acceleration voltage set to −4 kV and the emission to 20 mA, the nitrogen gas was transformed into plasma.

The active material layer obtained was analyzed by fluorescent X-ray spectroscopy, and the result showed that the composition of the active material (compound containing silicon and nitrogen) was $SiN_{0.2}$.

Using the negative electrode 7B, a test battery 7B was produced in the same manner as in Example 1.

Table 12 summarizes the physical properties of the negative electrodes 7A and 7B.

TABLE 12

|  | Negative electrode 7A | Negative electrode 7B |
|---|---|---|
| Composition of intermediate layer | $SiO_{0.6}$ | $SiO_{0.6}$ |
| Composition of active material layer | $SiTi_{0.2}$ | $SiN_{0.2}$ |
| Diffusion width | 50 nm | 49 nm |
| Thickness of intermediate layer | 1 μm | 1 μm |
| Thickness of active material layer | 9 μm | 9 μm |

The capacity retention rates of the batteries 7A and 7B were measured in the same manner as described above. The negative electrodes 7A and 7B after 100 cycles were observed in the same manner as described above. Table 13 shows the results.

TABLE 13

|  | Capacity retention rate | Observation of negative electrode |
|---|---|---|
| Battery 7A | 88% | Active material layer was not separated |
| Battery 7B | 87% | Active material layer was not separated |

As shown by Table 13, the batteries 7A to 7B exhibited good cycle characteristics. This is probably because the intermediate layer suppressed the diffusion of copper, thereby preventing the interface between the copper foil and the intermediate layer from becoming brittle. The result of the battery 7A indicates that even the use of the alloy containing silicon and titanium as the active material can provide the effects of the present invention. The result of the battery 7B indicates that even the use of the compound containing silicon and nitrogen as the active material can provide the effects of the present invention.

Example 8

An intermediate layer and an active material layer including a plurality of columnar particles were formed on a roughened surface of copper foil. The columnar particles were inclined relative to the direction of the normal to the surface of the current collector. Lithium was deposited on the active material layer in the same manner as in Example 1.

<i> Negative Electrode 8A

A 12-μm thick electrolytic copper foil with a surface roughness Rz of 10 μm (available from Furukawa Circuit Foil Co., Ltd.) was cut into a size of 40 mm×40 mm and used as the current collector. In forming an intermediate layer, deposition was performed by setting the angle a between the support 42 and a horizontal plane to 63°, the oxygen flow rate to 30 sccm, and the deposition time to 30 seconds. In forming an active material layer, deposition was performed by setting the angle a between the support 42 and a horizontal plane to 63°, the oxygen flow rate to 15 sccm, and the deposition time to 8 minutes. A negative electrode 8A was produced in the same manner as in Example 1 except for these conditions. When each of the intermediate layer and the active material layer was formed, the temperature of the base plate (current collector) was 320° C.

Using the negative electrode 8A, a test battery 8A was produced in the same manner as in Example 1.

Table 14 summarizes the physical properties of the negative electrode 8A.

TABLE 14

|  | Negative electrode 8A |
|---|---|
| Composition of intermediate layer | $SiO_{0.6}$ |
| Composition of active material layer | $SiO_{0.3}$ |
| Diffusion width | 53 nm |
| Thickness of intermediate layer | 1 μm |
| Thickness of active material layer | 13 μm |

In the negative electrode 8A, the intermediate layer and the active material layer are composed of columnar particles that have grown in a slanting direction. The capacity retention rate of the battery 8A was measured in the same manner as described above. The negative electrode 8A after 100 cycles was observed in the same manner as described above. Table 15 shows the results.

TABLE 15

|  | Capacity retention rate | Observation of negative electrode |
|---|---|---|
| Battery 8A | 92% | Active material layer was not separated and neither was current collector wrinkled |

As shown by Table 15, the battery 8A exhibited a good cycle characteristic. This indicates that even when the intermediate layer and the active material layer are composed of a plurality of columnar particles instead of being a uniform film, the effects of the present invention can be obtained.

Experimental Example 1

With respect to the negative electrode 1A, the diffusion width of copper and the region in which copper diffused were analyzed in more detailed manners.

Specifically, the interface between the intermediate layer and the copper foil of the negative electrode 1A was analyzed with a transmission electron microscope (TEM), an X-ray microanalyzer (electron probe microanalyzer) (EPMA), and an electron diffractometer. To prepare a sample for TEM observation, the negative electrode 1A was worked into a size of 10 μm×10 μm×0.1 μm. For TEM and EPMA analyses, a JEM-4000EX available from Japan Electron Optics Laboratory Co., Ltd. was used, and the acceleration voltage was set to 400 kV.

FIG. 7A is a TEM photo of the interface between the copper foil and the intermediate layer of the negative electrode 1A. In FIG. 7A, the bright area is the intermediate layer, and the dark area is the copper foil. The boundary between the bright area and the dark area is the interface. It can be seen that the intermediate layer is clearly distinguishable from the copper foil.

FIG. 7B shows the result of elemental analysis along the line shown in FIG. 7A. The diffusion width of copper determined from the copper ratio was approximately 10 nm.

Figure 7C:
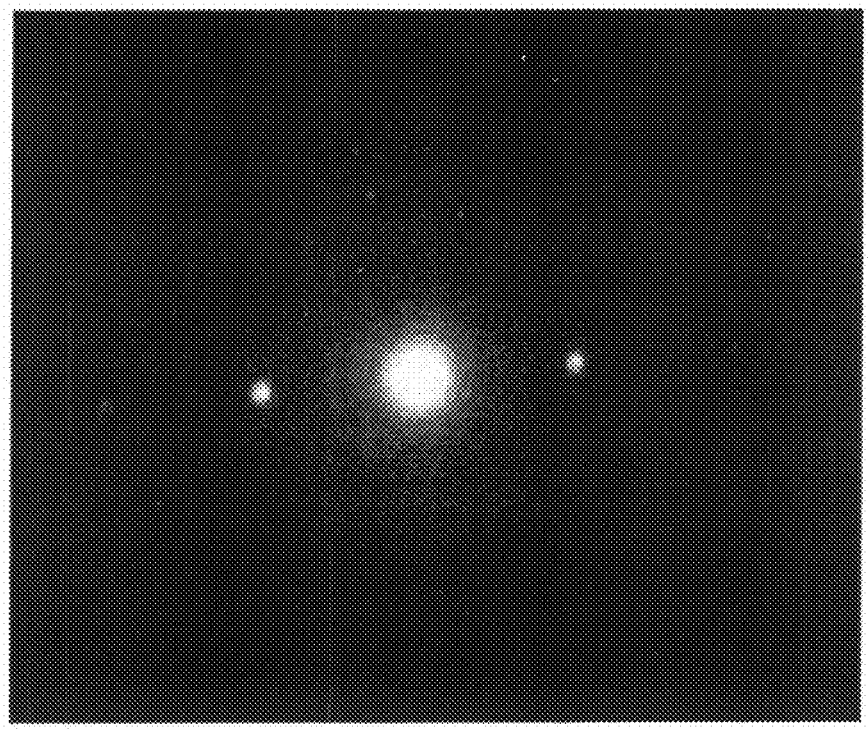
FIG. 7C is an electron diffraction image of the region surrounded by the circle in FIG. 7A.

FIG. 7C shows the result of electron diffraction analysis of the region surrounded by the circle shown in FIG. 7A. The spots in the figure agreed with the values of copper from the X-ray diffraction standard data (JCPDS). No diffraction spots other than these spots were found, and no diffraction spots attributed to $SiO_{0.6}$ (intermediate layer) were found. This is probably because $SiO_{0.6}$ is amorphous.

The above measurement results indicate that the diffusion width of copper is 10 nm or less, and that at the interface between the copper and the intermediate layer, there is no alloy of the copper and the elements contained in the intermediate layer. It should be noted that since TEM enables an analysis of a smaller region than ESCA, the diffusion width of copper obtained by TEM was different from that by ESCA. This is probably because the diffusion width of copper obtained by ESCA contains errors resulting from argon sputtering and errors caused by the asperities of the current collector surface.

Comparative Example 2

A negative electrode 9A was produced in the following manner, and the diffusion width of copper and the region in which copper diffused were analyzed in detail in the same manner as in Experimental Example 1.

A Si thin film was formed as the intermediate layer on the same copper foil as that of Example 1 by using an RF magnetron sputtering device. A silicon with a diameter of 4 inches and a thickness of 5 mm was used as the target. Argon gas was introduced into a vacuum chamber at a flow rate of 100 sccm and the pressure inside the chamber was adjusted to 20 mTorr. With the output of a high frequency power source being set to 100 W, sputtering was performed for 3 minutes. The thickness of the intermediate layer (Si thin film) obtained was 50 nm. The temperature of the base plate was 150° C.

An active material was then deposited on the intermediate layer by using the same vapor deposition device as that of Example 1.

The copper foil with the silicon thin film was fixed to the support 42 and the copper foil was positioned horizontally such that the angle α between the support and a horizontal plane was 0°. The acceleration voltage of the electron beam applied to the silicon target 45 was set to −8 kV and the emission was set to 500 mA. The oxygen flow rate was set to 40 sccm and the deposition time was set to 90 seconds. Under these conditions, a negative electrode active material layer 12c was formed. The negative electrode thus obtained was designated as a negative electrode 9A.

FIG. 8A is a TEM photo of the interface between the copper foil and the intermediate layer of the negative electrode 9A. In FIG. 8A, the bright area is the intermediate layer. It can be seen that between the intermediate layer and the copper foil are present an A layer and a B layer which are different from either of them.

FIG. 8B shows the result of elemental analysis along the line shown in FIG. 8A. The EPMA result shown in FIG. 8B indicates that the A layer and the B layer are composed of copper and Si. It is believed that the A layer is a layer formed by diffusion of copper into the intermediate layer (Si thin film) and that the B layer is a layer formed by diffusion of Si of the intermediate layer into the copper foil.

Figure 8C:
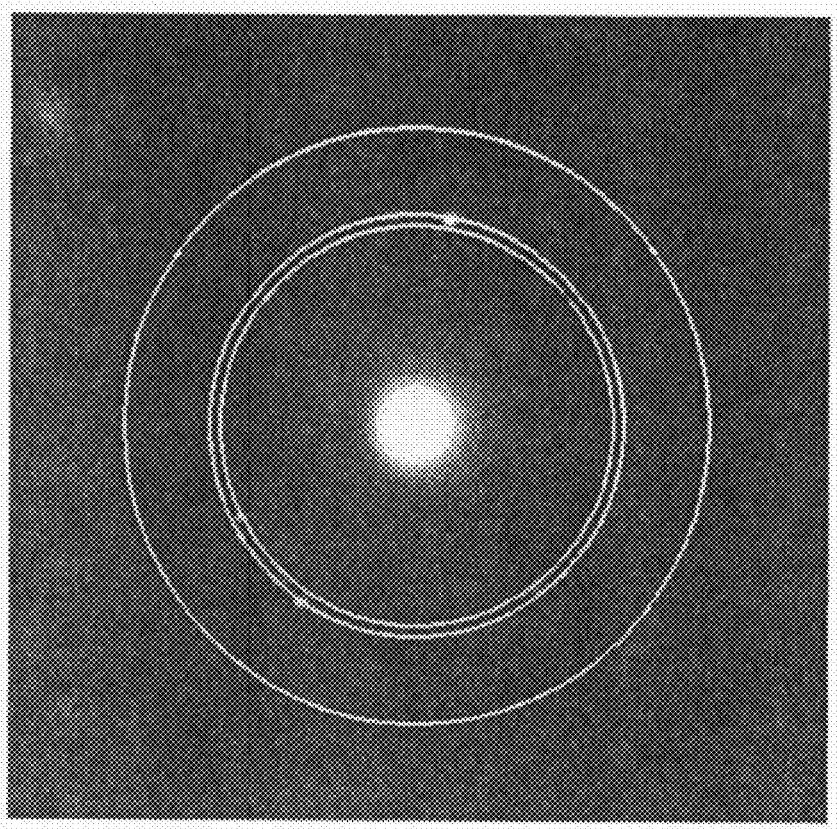
FIG. 8C is an electron diffraction image of the region surrounded by the circle in FIG. 8A.

FIG. 8C shows the result of electron diffraction analysis of the region surrounded by the circle shown in FIG. 8A. The three spots in the figure agreed with the values of $Cu_3Si$ from the X-ray diffraction standard data (JCPDS). This indicates that the A layer and the B layer are the layers containing at least $Cu_3Si$, and that copper did not diffuse into $SiO_{0.3}$.

The above results show that when the Si thin film and the copper foil are in contact with each other, copper is apt to diffuse into the Si thin film from the copper foil and that Si is apt to diffuse into the copper foil from the Si thin film. The results also reveal that the layers formed by such diffusion contain an alloy such as $Cu_3Si$.

Example 9

The active material layer including columnar particles comprising a plurality of subparticles was examined. Lithium was deposited on the active material layer in the same manner as in Example 1.

<i> Negative Electrode 10A

The same copper foil with the intermediate layer as that of Example 8 was placed on the support 42. The support 42 was inclined such that the angle a between itself and a horizontal plane was 60°. The acceleration voltage of the electron beam applied to the silicon target 45 was set to −8 kV and the emission was set to 500 mA. The oxygen flow rate was set to 80 sccm. In this state, deposition was performed for 1 minute to form subparticles as the first layer.

Next, second-layer subparticles were formed on the first-layer subparticles in the same conditions as described above, except that the support 42 was inclined such that the angle a between itself and a horizontal plane was 120° (180°−60°) and that the oxygen flow rate was set to 69 sccm. Thereafter, this operation was repeated by changing the angle a alternately to 60° or 120°, to form a negative electrode active material layer including a plurality of columnar particles each including subparticles of eight layers as illustrated in FIG. 4.

A negative electrode 10A was produced in the same manner as in Example 1 except that the active material layer was formed in the above manner. The thickness of the active material layer (total thickness of the subparticles) was 16 μm.

A test battery 10A was produced in the same manner as in Example 1 except for the use of the negative electrode 10A. The amount of oxygen contained in the negative electrode active material layer was determined by the combustion method, and the result showed that the composition of the compound including silicon and oxygen was $SiO_{0.5}$. Table 16 shows the physical properties of the negative electrode 10A.

TABLE 16

|  | Negative electrode 10A |
| --- | --- |
| Composition of intermediate layer | $SiO_{0.6}$ |
| Composition of active material layer | $SiO_{0.5}$ |
| Diffusion width | 50 nm |
| Thickness of intermediate layer | 1 μm |
| Thickness of active material layer | 16 μm |

The capacity retention rate of the battery 10A was measured in the same manner as described above. The negative electrode 10A after 100 cycles was observed in the same manner as described above. Table 17 shows the results.

TABLE 17

|  | Capacity retention rate | Observation of negative electrode |
| --- | --- | --- |
| Battery 10A | 93% | Active material layer was not separated and neither was current collector wrinkled |

As described above, even when columnar particles including a plurality of subparticles that were laminated and inclined in different directions were formed, the occurrence of wrinkles was suppressed and an excellent cycle characteristic was obtained in the same manner as in Example 8. This is probably because when the columnar particles include the plurality of subparticles, space can be formed around the columnar particles and the stress due to the expansion of the active material could be relieved. Also, the excellent cycle characteristic can be obtained probably because the collision of adjacent columnar particles was suppressed. Further, according to the above-described formation method, it is possible to obtain columnar particles that are apparently parallel to the direction of the normal of the current collector. Such columnar particles can suppress the interfacial stress due to expansion more effectively than inclined columnar particles. Probably for this reason, even when the active material layer was thick, the occurrence of wrinkles was suppressed.

The present invention is applicable to various lithium ion secondary batteries, and is particularly effective for lithium ion secondary batteries which are required to provide high capacity and good cycle characteristics. The shape of lithium ion secondary batteries to which the present invention is applicable is not particularly limited, and may be any shape such as a coin, button, sheet, cylindrical, flat, or prismatic shape. The electrode assembly composed of a positive electrode, a negative electrode, and a separator may be wound or layered. The battery size may be small as in compact portable appliances, etc. or may be large as in electric vehicles, etc. The lithium ion secondary batteries of the present invention can be used as the power source for, for example, personal digital assistants, portable electronic devices, small-sized power storage devices for home use, two-wheel motor vehicles, electric vehicles, and hybrid electric vehicles, and their uses are not particularly limited.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A negative electrode for a lithium ion secondary battery, comprising a current collector, an intermediate layer formed on a surface of said current collector, and an active material layer formed on said intermediate layer,
wherein said current collector comprises a metal capable of being alloyed with silicon,
said active material layer comprises an active material comprising silicon,
said intermediate layer comprises silicon and oxygen,
said intermediate layer prevents said metal capable of being alloyed with silicon from diffusing into said active material layer, and
said active material forms a plurality of columnar particles.

2. The negative electrode for a lithium ion secondary battery in accordance with claim 1, wherein said intermediate layer comprises $SiO_x$ where $0.1 \leq x < 2$.

3. The negative electrode for a lithium ion secondary battery in accordance with claim 1, wherein said active material layer further includes oxygen, nitrogen, or titanium.

4. The negative electrode for a lithium ion secondary battery in accordance with claim 1, wherein said metal capable of being alloyed with silicon is copper or nickel.

5. The negative electrode for a lithium ion secondary battery in accordance with claim 1, wherein said metal capable of being alloyed with silicon diffuses into said intermediate layer to form a mixed layer, and said mixed layer has a thickness of 1 μm or less.

6. The negative electrode for a lithium ion secondary battery in accordance with claim 1, wherein said columnar particles are inclined relative to the direction of the normal to the surface of said current collector.

7. The negative electrode for a lithium ion secondary battery in accordance with claim 1, wherein said columnar particles include a plurality of subparticles, and said subparticles are laminated and grown slantwise relative to the direction of the normal to the surface of said current collector.

8. The negative electrode for a lithium ion secondary battery in accordance with claim 7, wherein said subparticles are grown in different directions.

9. The negative electrode for a lithium ion secondary battery in accordance with claim 1, wherein said active material layer has a thickness of 0.1 μm to 100 μm.

10. The negative electrode for a lithium ion secondary battery in accordance with claim 1, wherein said current collector has a thickness of 1 μm to 50 μm.

11. The negative electrode for a lithium ion secondary battery in accordance with claim 1, wherein the surface of said current collector carrying said intermediate layer has a surface roughness Rz of 0.1 μm to 100 μm.

12. The negative electrode for a lithium ion secondary battery in accordance with claim 1, wherein the surface of said current collector carrying said intermediate layer has asperities of a regular pattern.

13. The negative electrode for a lithium ion secondary battery in accordance with claim 5, wherein said mixed layer contains copper and at least one element X selected from the group consisting of chromium, carbon, and hydrogen, and the content of said element X is 10 mol % or less of the copper contained in said mixed layer.

14. The negative electrode for a lithium ion secondary battery in accordance with claim 1, wherein lithium has been provided on said active material layer by vapor deposition, thereby causing a reaction between said lithium and said active material.

15. A lithium ion secondary battery comprising a positive electrode, the negative electrode as recited in claim 1, a separator interposed between said positive electrode and said negative electrode, and an electrolyte.

* * * * *